(12) United States Patent
Misu et al.

(10) Patent No.: US 6,396,200 B2
(45) Date of Patent: *May 28, 2002

(54) THIN FILM PIEZOELECTRIC ELEMENT

(75) Inventors: Koichiro Misu; Tsutomu Nagatsuka; Shusou Wadaka, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/381,167
(22) PCT Filed: Aug. 4, 1998
(86) PCT No.: PCT/JP98/03471
§ 371 (c)(1),
(2), (4) Date: Sep. 16, 1999
(87) PCT Pub. No.: WO99/37023
PCT Pub. Date: Jul. 22, 1999

(30) Foreign Application Priority Data

Jan. 16, 1998 (JP) .......................... 10-006844
Jan. 16, 1998 (JP) .......................... 10-006845

(51) Int. Cl.[7] .............................. H01L 41/08
(52) U.S. Cl. .................. 310/348; 310/365; 310/311
(58) Field of Search ................. 310/311, 320, 310/329, 348, 349, 365

(56) References Cited

U.S. PATENT DOCUMENTS 4,757,581 A * 7/1988 Yamada et al. ............ 310/348
5,162,691 A * 11/1992 Mariani et al. ............ 310/321
5,608,362 A   3/1997 Nishimura et al. ........ 333/191
5,661,443 A   8/1997 Mancini .................... 333/191
5,789,845 A   8/1998 Wadaka et al. ............ 310/334
5,969,463 A * 10/1999 Tomita et al. ............. 310/320
6,105,225 A * 8/2000 Torii et al. ................. 310/321
6,111,341 A * 8/2000 Hirami ...................... 310/365

FOREIGN PATENT DOCUMENTS

| EP | 0 771 070 | * 5/1997 | ................. 310/334 |
| JP | 48-55688 | 8/1973 | |
| JP | 55-75324 A | 6/1980 | ............. H03H/9/13 |
| JP | 57-74532 | 5/1982 | |
| JP | 8-148968 A | 6/1996 | ............. H03H/9/17 |
| WO | 98/15984 | * 5/1997 | ................. 310/320 |

* cited by examiner

Primary Examiner—Thomas M. Dougherty

(57) ABSTRACT

A film bulk acoustic wave device, comprising: a substrate; a bottom electrode formed on one surface of the substrate; a piezoelectric film formed on the bottom electrode; and a first top electrode formed on the piezoelectric film, further comprises a second top electrode having a larger mass load than the first top electrode, and formed on the first top electrode on the piezoelectric film when viewed from the center of the first top electrode, wherein the piezoelectric film has a high-band-cut-off-type dispersion characteristic.

The cut-off frequency of a second top electrode portion piezoelectric film having a large mass load can be lower than the cut-off frequency of a first top electrode portion piezoelectric film, to thereby trap the energy of the acoustic wave in a region of the first top electrode portion side, so that good performance may be feasible.

24 Claims, 20 Drawing Sheets

THIN FILM PIEZOELECTRIC ELEMENT

This application is the national phase under 35 § 371 of PCT International Application No. PCT/JP98/03471 which has an International filing date of Aug. 4, 1998, which is designated the United States of America.

TECHNICAL FIELD

The present invention relates to a film bulk acoustic wave device, utilizing an acoustic wave, such as a resonator and a filter.

BACKGROUND ART

A film bulk acoustic wave device is to act as a resonator or a filter utilizing a piezoelectric material that serves to convert between an electric signal and an acoustic wave.

A description will be made of a conventional film bulk acoustic wave device with reference to the drawings. FIGS. 34 and 35 are views showing a configuration of a conventional film bulk acoustic wave device as described in, for example, "Fundamental mode VHF/UHF bulk acoustic wave resonators and filters on silicon", 1980, IEEE, Ultrasonics symposium, pp. 829–833 (hereinafter referred to as Reference 1). FIG. 34 is a top plan view and FIG. 35 is a sectional view of that shown in FIG. 34.

FIGS. 36 and 37 are also views showing a configuration of another conventional film bulk acoustic wave device as described in, for example, U.S. Pat. No. 4320365 (hereinafter referred to as Reference 2). FIG. 36 is a top plan view and FIG. 37 is a sectional view of that shown in FIG. 36.

Throughout FIGS. 34 to 37, reference symbol 1 denotes a silicon substrate; 2, a bottom electrode; 3, a piezoelectric film; 4, a top electrode; 5, a via hole; and 6, an acoustic resonance portion.

A film bulk acoustic wave device has characteristics depending upon the acoustic resonance portion 6. FIG. 38 shows in an enlarged manner the acoustic resonance portion 6 shown in FIG. 35. For the purpose of simplification, the bottom electrode 2 having an equal size to the top electrode 4 is shown herein; however, the actual film bulk acoustic wave device is shown in FIG. 35, in which the bottom electrode 2 is different in size from the top electrode 4.

In FIG. 38, a region of the piezoelectric film 3 which is covered with the top electrode 4 is designated as an electrode portion piezoelectric film 7a, while a region on the piezoelectric film 3 which is outside the top electrode 4 is designated as a non-electrode portion piezoelectric film 7b. The wave number of the acoustic waves in the electrode portion piezoelectric film 7a is given as "$k_m$", while the wave number of the acoustic waves in the non-electrode portion piezoelectric film 7b is given as "$k_f$".

When an electric signal is applied between the top electrode 4 and the bottom electrode 2, an electric field is generated between the top electrode 4 and the bottom electrode 2. Since the piezoelectric film 3 has an expanding/contracting property when an electric field is applied thereto, an elastic vibration is excited so as to correspond to the applied electric signal. In this regard, it depends upon materials of the piezoelectric film 3 used or crystal orientation thereof what vibration component of the elastic vibration is excited. In conventional film bulk acoustic wave devices, zinc oxide (ZnO) or aluminum nitride (AlN) is used for the piezoelectric film 3.

The electric field applied between the top electrode 4 and the bottom electrode 2 causes the electrode portion piezoelectric film 7a to excite the elastic vibration, to thereby excite the acoustic wave propagating in a direction of the thickness and the acoustic wave propagating in a direction parallel to the surface. In this regard, the top of the top electrode 4 and the bottom of the bottom electrode 2 are exposed to the air, so that the acoustic wave propagating in the thickness direction is substantially fully reflected on these surfaces exposed to the air. On the other hand, the acoustic wave propagating in the direction parallel to the surface exhibits different properties in propagation characteristic depending upon the electrode portion piezoelectric film 7a and the non-electrode portion piezoelectric film 7b.

FIG. 39 is a graph showing propagation characteristics of the acoustic wave as described in, for example, "Acoustic Wave Device Technology Handbook", edited by the 150th Committee of the Acoustic Wave Device Technology, the Japan Society for the Promotion of Science, pp. 82–87, 1991 (hereinafter referred to as Reference 3). In this graph, the x-axis represents the wave number of the acoustic waves propagating in the direction parallel to the surface of the piezoelectric film 3, in which the region where the wave number is a real number is shown at the right side of the y-axis, and the region where the wave number is an imaginary number is shown at the left side of the y-axis. The y-axis represents frequencies. Reference symbol 8 indicated by the solid line denotes a dispersion characteristic of the acoustic wave propagating within the electrode portion piezoelectric film 7a, and reference symbol 9 indicated by the broken line denotes a dispersion characteristic of the acoustic wave propagating within the non-electrode portion piezoelectric film 7b.

In FIG. 39, the wave number belonging to the real number indicates that the wave is in a propagation band where the wave can propagate in the direction parallel to the surface of the piezoelectric film 3. The wave number belonging to the imaginary number indicates that the wave is in a rejection band where the wave cannot propagate in the direction parallel to the surface of the piezoelectric film 3. The frequency that intersects the y-axis means a frequency for a resonance in the direction of the thickness of the piezoelectric film 3, that is, a thickness resonant frequency. The propagation band and the rejection band are bounded by this thickness resonant frequency and separated from each other, and the thickness resonant frequency is thus called a cut-off frequency. It is assumed herein that the cut-off frequency of the acoustic wave propagating within the electrode portion piezoelectric film 7a be "$f_{Om}$" while the cut-off frequency of the acoustic wave propagating within the non-electrode portion piezoelectric film 7b be "$f_{Of}$". In general, the electrode portion piezoelectric film 7a has a longer distance for the thickness resonance than the thickness of the non-electrode portion piezoelectric film 7b by the thicknesses of the top electrode 4 and the bottom electrode 2. In addition, a large influence of the mass loads of the top electrode 4 and the bottom electrode 2 on the electrode portion piezoelectric film 7a causes the cut-off frequency "$f_{Om}$" of the electrode portion piezoelectric film 7a to be lower than the cut-off frequency "$f_{Of}$" of the non-electrode portion piezoelectric film 7b.

The characteristics shown in FIG. 39 is such that the propagation band is formed within the frequency band higher than the cut-off frequency, and the rejection band is formed within the frequency band lower than the cut-off frequency. This characteristic indicating the rejection band for the frequency lower than the cut-off frequency is called "low-band-cut-off-type dispersion characteristic". Such a low-band-cut-off-type dispersion characteristic is possessed by conventionally broadly used zinc oxide (ZnO) or aluminum nitride (AlN).

When the piezoelectric film 3 having such a low-band cut-off-type dispersion characteristic is used, the frequency of the acoustic wave to be excited is higher. If the wave number "$k_m$" of the electrode portion piezoelectric film 7a and the wave number "$k_f$" of the non-electrode portion piezoelectric film 7b both belong to the real number, the acoustic wave excited by the electrode portion piezoelectric film 7a will propagate in the direction parallel to the surface of the piezoelectric film 3. Then, the acoustic wave will propagate in the non-electrode portion piezoelectric film 7b as it is.

On the other hand, in a frequency f intermediate between the thickness resonant frequency "$f_{0m}$" of the electrode portion piezoelectric film 7a and the thickness resonant frequency "$f_{0f}$" of the non-electrode portion piezoelectric film 7b, the propagation band is formed within the electrode portion piezoelectric film 7a, but the rejection band is formed within the non-electrode portion piezoelectric film 7b. Therefore, the acoustic wave propagating in the direction parallel to the surface is reflected on an interface between the electrode portion piezoelectric film 7a and the non-electrode portion piezoelectric film 7b, to thereby trap the energy of the acoustic wave in the electrode portion piezoelectric film 7a. This phenomenon is called "energy trapping", which can be used advantageously to realize a resonator having a high Q value representative of the resonance performance since the energy of the acoustic wave is not escaped from the electrode portion. Conventional film bulk acoustic wave device using zinc oxide (ZnO) can utilize the energy trapping to attain a resonator having a high Q value.

However, as described in "Acoustic Wave Device Technology Handbook", edited by the 150th Committee of the Acoustic Wave Device Technology, the Japan Society for the Promotion of Science, pp. 125–129, 1991 (hereinafter referred to as Reference 4), zinc oxide (ZnO) has an electromechanical coupling coefficient "$k_t$" of as low as about 0.3. In contrast, a lead-based piezoelectric material widely used in the field of piezoelectric ceramics, such as lead zirconate titanate (PZT) or lead titanate (PbTiO$_3$), has an electromechanical coupling coefficient "$k_t$" of 0.4–0.8. A lower electromechanical coupling coefficient causes a higher capacitance ratio when the material is used for the resonator and a narrower variable frequency range when, for example, the resonator is used to constitute a voltage-variable oscillator. Further, when it constitutes a filter, such a problem occurs that a lower electromechanical coupling coefficient causes a narrower bandwidth feasible with the same insertion loss. That is, there is a problem that material such as zinc oxide having a low electromechanical coupling coefficient may be largely restrictive in element performance to make up a device such as a resonator or a filter.

As opposed thereto, for example, lead titanate (PbTiO$_3$) representing lead-based piezoelectric ceramics has a large electromechanical coupling coefficient "$k_t$", which exhibits a high-band-cut-off-type dispersion characteristic as shown in FIG. 40. That is, the rejection band is formed within the frequency band higher than the cut-off frequency, and the propagation band is formed within the frequency band lower than the cut-off frequency. When a frequency f is higher than the cut-off frequency "$f_{0m}$" of the electrode portion piezoelectric film 7a and is lower than the cut-off frequency "$f_{0f}$" of the non-electrode portion piezoelectric film 7b, the rejection band is formed within the electrode portion piezoelectric film 7a, and the propagation band is formed within the non-electrode portion piezoelectric film 7b. Therefore, the energy cannot be trapped in the electrode portion piezoelectric film 7a, permitting the energy of the acoustic wave excited to propagate and escape toward the non-electrode portion piezoelectric film 7b. This causes a great loss.

As a method of realizing a piezoelectric device using such a high-band-cut-off-type piezoelectric film, a method shown in FIG. 41 is described in Reference 3. That is, a thickness "$h_2$" of the electrode portion piezoelectric film 7a is made thinner than a thickness "$h_1$" of the non-electrode portion piezoelectric film 7b, where the top electrode 4 and the bottom electrode 2 are arranged. It will be noted that the conventional piezoelectric device shown in FIG. 41 by way of example is not a film bulk acoustic wave device but a piezoelectric device using a sintered plate material of piezoelectric ceramics, which is used in a frequency of several tens MHz band or less.

FIG. 42 is a graph showing a dispersion characteristic for describing an operation of the conventional piezoelectric device shown in FIG. 41. If the piezoelectric film 3 has a uniform thickness and the thickness is set "$h_1$" as a whole, the cut-off frequency of the non-electrode portion piezoelectric film 7b will be "$f_{0f}$". The cut-off frequency will be "$f_{0m1}$" of the one formed with the electrodes on both sides, which is lower than the cut-off frequency "$f_{0f}$" of the non-electrode portion piezoelectric film 7b due to an influence of the mass loads of the electrodes and the like. In contrast, if the piezoelectric film 3 is made thinner than the non-electrode portion piezoelectric film 7b, the cut-off frequency "$f_{0m2}$" of the electrode portion piezoelectric film 7a will be higher. This is because the resonance length for the thickness resonance varies depending upon the thickness "$h_2$" of the piezoelectric film. A selection of a suitable thickness "$h_2$" may allow the cut-off frequency "$f_{0m2}$" of the electrode portion piezoelectric film 7a to be higher than the cut-off frequency "$f_{0f}$" of the non-electrode portion piezoelectric film 7b.

In this case, the dispersion characteristic 8 of the electrode portion piezoelectric film 7a can present the same wave number and a higher frequency than the dispersion characteristic 9 of the non-electrode portion piezoelectric film 7b. Therefore, the frequency which is higher than the cut-off frequency "$f_{0f}$" of the non-electrode portion piezoelectric film 7b and which is lower than the cut-off frequency "$f_{0m2}$" of the electrode portion piezoelectric film 7a provides actions of the electrode portion piezoelectric film 7a as the propagation band, and the non-electrode portion piezoelectric film 7b as the rejection band. That is, the energy of the acoustic wave can be trapped in the electrode portion piezoelectric film 7a, achieving a piezoelectric device having a reduced loss.

FIGS. 43 and 44 are views showing an example of another conventional piezoelectric device described in, for example, "Energy-Trapping for Backward-Wave-Mode Thickness-Vibrations by Controlling Piezoelectric Reaction", Transactions on The Institute of Electronics, Information and Communication Engineers, '79/1, Vol. J62-A, No. 1, pp. 8–15 (hereinafter referred to as Reference 5). FIG. 43 is a top plan view, and FIG. 44 is a sectional view. The top electrode 4 and the bottom electrode 2 which are both round are depicted herein.

In this case, again, it is not a film bulk acoustic wave device but a piezoelectric device using a sintered plate material of piezoelectric ceramics, which is used in a frequency having several tens MHz band or less. The electrode portion piezoelectric film 7a is polarized, while the non-electrode portion piezoelectric film 7b is not polarized. A capacitor 11 is inserted in series between the top electrode 4 and an electric terminal 12a.

FIG. 45 is a graph showing a dispersion characteristic for describing an operation of the conventional piezoelectric device shown in FIGS. 43 and 44. In this figure, reference symbol 13 denotes a dispersion characteristic of a non-electrode portion piezoelectric film which is polarized, 14, a dispersion characteristic of a non-electrode portion piezoelectric film which is not polarized, and 15, a dispersion characteristic anticipated from the electric terminal.

Many of lead-based piezoelectric ceramics such as lead titanate ($PbTiO_3$) can organize polarization within the piezoelectric film 3 by applying a series voltage to the piezoelectric film 3 while heating. Therefore, the region of the piezoelectric film 3 to be polarized can be limited, and FIGS. 43 and 44 shows an example in which the electrode portion piezoelectric film 7a is only polarized, but the non-electrode portion piezoelectric film 7b is not polarized. As described in Reference 5, the cut-off frequency "$f_{0f2}$" of the unpolarized non-electrode portion piezoelectric film 7b is lower in frequency than the cut-off frequency "$f_{0f1}$" of the polarized one, presenting the dispersion characteristic 13.

Since, the capacitor 11 having a suitable capacitance is inserted between the top electrode 4 and the electric terminal 12a, the thickness resonant frequency "$f_{0m2}$" of the electrode portion piezoelectric film 7a which is anticipated from the electric terminal 12a can be effectively made higher than the cut-off frequency "$f_{0m1}$" of the electrode portion piezoelectric film 7a, presenting the dispersion characteristic 15. Then, the operation for anticipation from the electric terminal 12a exhibits the dispersion characteristic 15 for the electrode portion piezoelectric film 7a and the dispersion characteristic 13 for the non-electrode portion piezoelectric film 7b. Therefore, if a frequency f is higher than the cut-off frequency "$f_{0f2}$" of the non-electrode portion piezoelectric film 7b, and is lower than the thickness resonant frequency "$f_{0m2}$" of the electrode portion piezoelectric film 7a which is anticipated from the electric terminal 12a, the propagation band is formed within the electrode portion piezoelectric film 7a, and the rejection band is formed within the non-electrode portion piezoelectric film 7b. As a result, the energy trapping will be feasible.

FIGS. 46 and 47 are views showing an example of another conventional piezoelectric device described in Reference 5, for example. FIG. 46 is a top plan view, and FIG. 47 is a sectional view. The top electrode 4 and the bottom electrode 2 which are both round is depicted herein.

In this case, again, it is not a film bulk acoustic wave device but a piezoelectric device using a sintered plate material of piezoelectric ceramics, which is used in a frequency having several tens MHz band or less. In these figures, reference symbol 16 denotes a short-circuit electrode, and 17, a short-circuit electrode portion piezoelectric film. In the example described in Reference 5, the short-circuit electrode portion piezoelectric film 17 is polarized. The short-circuit electrode 16 is slightly spaced and arranged on the outer side of the top electrode 4, and the short-circuit electrode 16 is electrically short-circuited with the bottom electrode 2. A capacitor 11 is also inserted in series between the top electrode 4 and an electric terminal 12a.

FIG. 48 is a graph showing a dispersion characteristic for describing an operation of the conventional piezoelectric device shown in FIGS. 46 and 47. In this figure, reference symbol 18 denotes a dispersion characteristic of the short-circuit electrode portion piezoelectric film 17.

As described in Reference 5, the cut-off frequency "$f_{0f2}$" of the short-circuit electrode portion piezoelectric film 17 the surface of which is covered with the short-circuit electrode 16 and the bottom electrode 2 is reduced in frequency than the cut-off frequency "$f_{0f1}$" of the non-electrode portion piezoelectric film 7b the surface of which is a free surface, presenting the dispersion characteristic 18.

Further, since, the capacitor 11 having a suitable capacitance is inserted between the top electrode 4 and the electric terminal 12a, the thickness resonant frequency "$f_{0m2}$" of the electrode portion piezoelectric film 7a which is anticipated from the electric terminal 12a can be effectively higher than the cut-off frequency "$f_{0m1}$" of the electrode portion piezoelectric film 7a, presenting the dispersion characteristic 15. The operation for anticipation from the electric terminal 12a exhibits the dispersion characteristic 15 for the electrode portion piezoelectric film 7a and the dispersion characteristic 18 for the short-circuit electrode portion piezoelectric film 17. Therefore, if a frequency f is higher than the cut-off frequency "$f_{0f2}$" of the short-circuit electrode portion piezoelectric film 17, and is lower than the thickness resonant frequency "$f_{0m2}$" of the electrode portion piezoelectric film 7a anticipated from the electric terminal 12a, the propagation band is formed within the electrode portion piezoelectric film 7a, and the rejection band is formed within the short-circuit electrode portion piezoelectric film 17. As a result, the energy trapping will be feasible.

In the above-described conventional film bulk acoustic wave devices, zinc oxide (ZnO) or aluminum nitride (AlN) have used for piezoelectric films. These piezoelectric films exhibit a low-band-cut-off-type dispersion characteristic in which a propagation band is formed within the frequency band higher than the cut-off frequency, and a rejection band is formed within the frequency band lower than the cut-off frequency. The energy trapping would be feasible in which the energy of the acoustic wave may be trapped in the electrode portion piezoelectric film 7a. A resonator having a high Q value, a filter with low loss or the like would also be feasible. However, there is such a problem that zinc oxide (ZnO) or aluminum nitride (AlN) having a low electromechanical coupling coefficient may be largely restrictive in device performance for realizing a resonator or a filter.

Further, when a piezoelectric device is attained using not a film bulk acoustic wave device but a lead-based piezoelectric ceramics having a high electromechanical coupling coefficient, depending upon the piezoelectric film used, the piezoelectric device may exhibit a high-band-cut-off-type dispersion characteristic in which a rejection band is formed within the frequency band higher than the cut-off frequency. In this case, since the energy of the acoustic wave cannot be trapped in the electrode portion piezoelectric film 7a, there is a drawback in that a piezoelectric device having a sufficient performance would not be feasible.

In order to solve the foregoing disadvantage, there has been known a conventional method of reducing the thickness of the electrode portion piezoelectric film 7a so as to be thinner than the non-electrode portion piezoelectric film 7b at the outer side thereof. This method requires an etching by a liquid or plasma to be applied to the piezoelectric film 3. Strictly, However, the piezoelectric film has a polycrystalline structure formed by gathering fine grains, each of which is a single crystal, and has a property in that a grain boundary surface of the polycrystalline grain is exposed upon the etching. A film bulk acoustic wave device is designed to operate in a frequency ranging from several hundreds MHz to several GHz or more, with the wavelength of the acoustic wave in the piezoelectric film being as extremely small as micron or submicron unit. The piezoelectric film requires the surface smoothness less than a fraction of the wavelength, so that the surface smoothness required for the above-described film bulk acoustic wave device is extremely low. The dimension of the grain boundary of the above polycrystalline grain is often some tens microns to some hundreds microns, which is rough compared to the required surface smoothness. In other words, for the film bulk acoustic wave device, it is difficult in manufacturing to partially reduce the thickness of the piezoelectric film.

As is apparent from FIGS. 35 and 37, the piezoelectric film 3 in the film bulk acoustic wave device is also a critical structural material for mechanically supporting the vicinity of the electrode portions so arranged as to be floated by a via hole 5. Meanwhile, as described in "Epitaxial Growth of ZnO Thin Films on c-plane Sapphire Substrates by ECR-assisted MBE Technique", the 150th Committee of the Acoustic Wave Device Technology, the Japan Society for the Promotion of Science, the 52nd seminar paper, pp. 1–6, 1997 (hereinafter referred to as Reference 6), or "GHz Band Film Bulk Acoustic Wave Filters Using Reduced Piezoelectric Area", the 1997 Engineering Sciences Society Event, The Institute of Electronics, Information and Communication Engineers, A-11-6, p. 163, 1997 (hereinafter referred to as Reference 7), an internal stress always exists within the piezoelectric film 3, which is often a compressive stress, and such a stress as to warp the piezoelectric film thus exists. Therefore, there occurs a following problem. That is, if the piezoelectric film 3 is so arranged as to be thinned in part, such a stress is concentrated on an end surface that is reduced in thickness, to generate a large deformation on this end surface. This may significantly deteriorate the performance of the film bulk acoustic wave device, or may cause a breakage of the film bulk acoustic wave device.

Such a method has been heretofore known that the electrode portion piezoelectric film 7a is only polarized, and the non-electrode portion piezoelectric film 7b is unpolarized while the capacitor 11 is inserted in series to the top electrode 4, to thereby effectively make the thickness resonant frequency "$f_{0m2}$" of the electrode portion piezoelectric film 7a anticipated from the electric terminal 12a higher than the cut-off frequency "$f_{0f2}$" of the non-electrode portion piezoelectric film 7b. This causes the cut-off frequency "$f_{0f1}$" of the unpolarized non-electrode portion piezoelectric film 7b to be lower than the cut-off frequency "$f_{0f1}$" of the polarized non-electrode portion piezoelectric film 7b to the extent necessary. This also requires the thickness resonant frequency "$f_{0m2}$" of the electrode portion piezoelectric film 7a which is anticipated from the electric terminal 12a to be higher than the cut-off frequency "$f_{0f2}$" of the unpolarized non-electrode portion piezoelectric film 7b because of the insertion of the capacitor 11. However, the condition satisfying this is restrictive. For example, if gold (Au) or platinum (Pt) having a large mass load effect is used for the top electrode 4, the cut-off frequency "$f_{0m1}$" of the electrode portion piezoelectric film 7a is so lower than the cut-off frequency "$f_{0f2}$" of the non-electrode portion piezoelectric film 7b. Therefore, even with the insertion of the capacitor 11, it will be difficult to make the thickness resonant frequency "$f_{0m2}$" of the electrode portion piezoelectric film 7a which is anticipated from the electric terminal 12a lower than the cut-off frequency "$f_{0f2}$" of the non-electrode portion piezoelectric film 7b.

In the conventional piezoelectric ceramics manufactured by sintering ceramics which is broadly used in a low frequency, the orientation of the polarization within each crystal grain is disorganized for the unpolarized one, so that the polarization within each crystal grain is cancelled in the piezoelectric ceramics as a whole. Thus, no piezoelectric property will be found. Meanwhile, the piezoelectric film 3 having often the polarization in a certain orientation as a whole even with a disorganized polarization within each crystal grain provides a low piezoelectric property even for the unpolarized one. Accordingly, the piezoelectric film has a lower characteristic difference between the unpolarized and polarized piezoelectric thin films than the piezoelectric ceramics manufactured by sintering ceramics. A difference in frequency is low between the cut-off frequency "$f_{0f2}$" of the unpolarized non-electrode portion piezoelectric film 7b and the cut-off frequency "$f_{0f1}$" of the polarized non-electrode portion piezoelectric film 7b. Therefore, it is difficult to make the thickness resonant frequency "$f_{0m2}$" of the electrode portion piezoelectric film 7a which is anticipated from the electric terminal 12a lower than the cut-off frequency "$f_{0f2}$" of the non-electrode portion piezoelectric film 7b.

The method of forming the short-circuit electrode 16 at an outer side of the top electrode 4 requires for the short-circuit electrode 16 and the bottom electrode 2 to be electrically short-circuited with each other. However, for the device manufactured mainly through the semiconductor process, like the film bulk acoustic wave device, the method of connecting the short-circuit electrode 16 and the bottom electrode 2 through a through hole opened in the piezoelectric film 3 cannot be used as practical connection means, because the feasible through hole diameter is large. Also, the method of connection at the end surface at an outer side of the piezoelectric film 3 is associated with the following problem. With a distance from the end surface at the outer side of the piezoelectric film 3 to the end surface on the top electrode 4 side, the potential at the end surface of the short-circuit electrode 16 on the top electrode 4 side may not be set to the ground potential due to a resistance component or a reactance component of the short-circuit electrode 16. Therefore, the dispersion characteristic of the short-circuit electrode portion piezoelectric film 17 may deviate from the dispersion characteristic when the short-circuit electrode 16 is set to the ground potential. In particular, this greatly affects the film bulk acoustic wave device used in a high frequency, and there is difficulty in that a designed characteristic will not be feasible.

The present invention has been made in order to solve the foregoing problems, and an object of the present invention is to obtain a film bulk acoustic wave device capable of attaining the good performance using a piezoelectric film having a large electromechanical coupling coefficient.

DISCLOSURE OF THE INVENTION

To begin with, a film bulk acoustic wave device in accordance with the present invention is designed to have a second electrode with an increased thickness placed on the top of a top electrode or the like, and the structure is as follows.

A film bulk acoustic wave device is provided in accordance with the present invention, comprising: a substrate; a bottom electrode formed on one surface of the substrate; a piezoelectric film formed on the bottom electrode; and a first top electrode formed on the piezoelectric film, further comprises a second top electrode having a larger mass load than the first top electrode, which is formed at an outer side of the first top electrode on the piezoelectric film when viewed from the center of the first top electrode, in which the piezoelectric film has a high-band-cut-off-type dispersion characteristic.

Further, a film bulk acoustic wave device is provided in accordance with the present invention, wherein the first and second top electrodes are integrally formed, and the second top electrode has a larger thickness than that of the first top electrode.

Still further, a film bulk acoustic wave device is provided in accordance with the present invention, wherein the product of the electrode thickness and the density of the second top electrode is larger than the product of the electrode thickness and the density of the first top electrode.

Still further, a film bulk acoustic wave device is provided in accordance with the present invention, wherein the second top electrode is laid on a part of the first top electrode.

Still further, a film bulk acoustic wave device is provided in accordance with the present invention, wherein the first top electrode and the second top electrode are connected with each other.

Still further, a film bulk acoustic wave device is provided in accordance with the present invention, wherein the second top electrode having a narrower width than that of the first top electrode is laid on the first top electrode.

Still further, a film bulk acoustic wave device is provided in accordance with the present invention, wherein the first and second top electrodes are divided into two.

Still further, a film bulk acoustic wave device is provided in accordance with the present invention, wherein a third top electrode is formed on the piezoelectric film between the two divided first top electrodes.

Still further, a film bulk acoustic wave device is provided in accordance with the present invention, wherein the substrate is a semiconductor substrate or a dielectric substrate.

Still further, a film bulk acoustic wave device is provided in accordance with the present invention, wherein the piezoelectric film has a Poisson ratio lower than 0.34.

Still further, a film bulk acoustic wave device is provided in accordance with the present invention, wherein the piezoelectric film contains lead titanate ($PbTiO_3$) as a major component.

Still further, a film bulk acoustic wave device is provided in accordance with the present invention, wherein a dielectric layer is inserted between the substrate and the bottom electrode.

Next, a film bulk acoustic wave device in accordance with the present invention is designed to have a dielectric placed on the top of a top electrode or the like, and the structure is as follows.

A film bulk acoustic wave device in accordance with the present invention, comprising: a substrate; a bottom electrode formed on one surface of the substrate; a piezoelectric film formed on the bottom electrode; and a top electrode formed on the piezoelectric film, further comprises a dielectric formed at an outer side of the top electrode on the piezoelectric film when viewed from the center of the top electrode, in which the piezoelectric film has a high-band-cut-off-type dispersion characteristic.

Further, a film bulk acoustic wave device is provided in accordance with the present invention, wherein the dielectric is formed on a part of the top electrode.

Still further, a film bulk acoustic wave device is provided in accordance with the present invention, wherein the product of the film thickness and the density of the dielectric is larger than the product of the electrode thickness and the density of the top electrode.

Still further, a film bulk acoustic wave device is provided in accordance with the present invention, wherein the dielectric is laid on a part of the top electrode.

Still further, a film bulk acoustic wave device is provided in accordance with the present invention, wherein the top electrode and the dielectric are connected with each other.

Still further, a film bulk acoustic wave device is provided in accordance with the present invention, wherein the dielectric having a narrower width than that of the top electrode is laid on the top electrode.

Still further, a film bulk acoustic wave device is provided in accordance with the present invention, wherein the top electrode and the dielectric are divided into two.

Still further, a film bulk acoustic wave device is provided in accordance with the present invention, wherein a second top electrode is formed on the piezoelectric film between the two divided first top electrodes.

Still further, a film bulk acoustic wave device is provided in accordance with the present invention, wherein the substrate is a semiconductor substrate or a dielectric substrate.

Still further, a film bulk acoustic wave device is provided in accordance with the present invention, wherein the piezoelectric film has a Poisson ratio lower than 0.34.

Still further, a film bulk acoustic wave device is provided in accordance with the present invention, wherein the piezoelectric film contains lea d titanate ($PbTiO_3$) as a major component.

Still further, a film bulk acoustic wave device is provided in accordance with the present invention, wherein a dielectric layer is inserted between the substrate and the bottom electrode.

BEST MODE FOR CARRYING OUT THE INVENTION

Embodiments of the present invention will be described below with reference to the drawings.

Described first in Embodiments 1 to 8 below is a film bulk acoustic wave device in which a second top electrode with increased thickness is formed on the top of a top electrode or the like.

Embodiment 1

Figure 1:
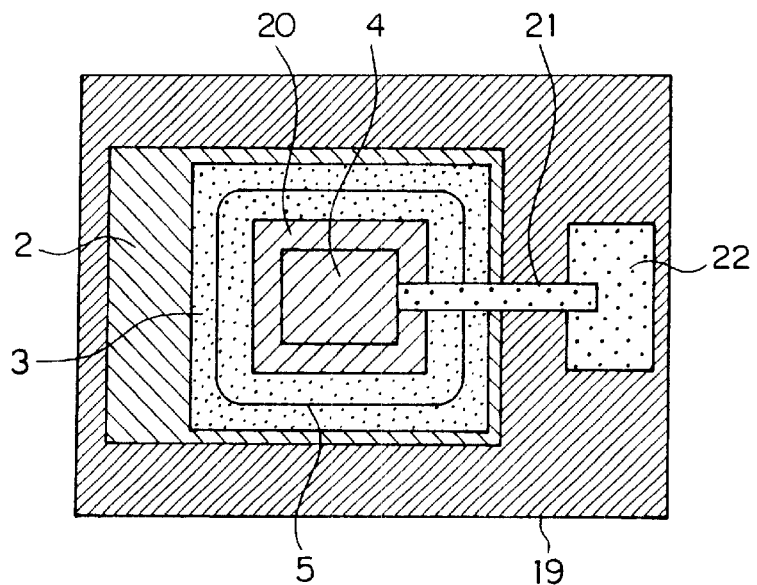
FIG. 1 is a view showing the top of a film bulk acoustic wave device according to Embodiment 1 of the present invention.
Figure 2:
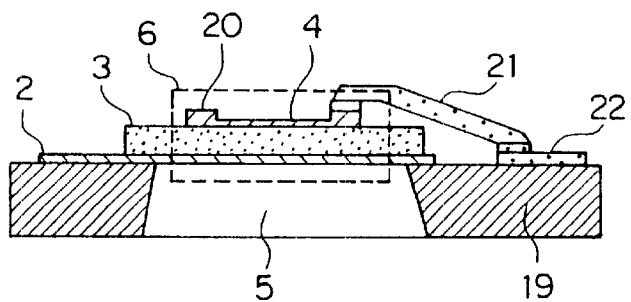
FIG. 2 is a view showing in section the film bulk acoustic wave device according to Embodiment 1 of the present invention.

A description will be made with reference to FIGS. 1 to 4 on a film bulk acoustic wave device according to Embodiment 1 of the present invention. FIG. 1 is a view showing the top of the film bulk acoustic wave device according to Embodiment 1 of the present invention. FIG. 2 is a view showing in section the film bulk acoustic wave device according to Embodiment 1 of the present invention. In the drawings, identical symbols denote identical or corresponding portions.

In FIGS. 1 and 2, reference symbol 19 denotes a semiconductor substrate or a dielectric substrate; 2, a bottom electrode; 3, a piezoelectric film; 4, a top electrode; 5, a via hole; 6, an acoustic resonance portion; 20, a top electrode formed by increasing thickness of the top electrode 4; 21, an air bridge; and 22, a pad.

The semiconductor substrate or dielectric substrate 19, as it does not have direct influence on an acoustic characteristic of the film bulk acoustic wave device, may be either a conventionally used semiconductor substrate such as a silicon (Si) semiconductor substrate and a gallium arsenic (GaAs) semiconductor substrate, or an insulating dielectric substrate having no semiconductor characteristic such as a glass, sapphire or magnesium oxide (MgO) substrate. The silicon (Si) substrate, the gallium arsenic (GaAs) substrate and the magnesium oxide (MgO) substrate in particular have good characteristic in high-temperature resistance and are excellent substrate materials. Hereinafter, the semiconductor substrate or dielectric substrate 19 is generically referred to as the semiconductor substrate 19.

The bottom electrode 2 is formed on this semiconductor substrate 19. In some cases, a dielectric layer made of silicon oxide (SiO, $SiO_2$), silicon nitride (SiN) or the like may be inserted between the semiconductor substrate 19 and the bottom electrode 2. This may be applied to all Embodiments shown below. On the bottom electrode 2, the piezoelectric film 3 is formed and the top electrode 4 is further formed on the piezoelectric film 3.

Though the air bridge 21 is used to electrically connect the top electrode 4 and the pad 22, the electrode may sometimes be connected to the pad 22 using a line adhered to the surface of the piezoelectric film 3.

The via hole 5 is formed from the back surface of the semiconductor substrate 19 to obtain a structure in which the bottom surface of the bottom electrode 2 is exposed to the air. In the case that the dielectric layer described above is inserted, there is the choice between removing also the dielectric layer so that the bottom surface of the bottom electrode 2 is exposed to the air and exposing to the air the bottom surface of the dielectric layer. Those structures are the same as in film bulk acoustic wave devices of the prior art.

However, this film bulk acoustic wave device according to Embodiment 1 uses for the piezoelectric film 3 a material having the high-band-cut-off-type dispersion characteristic, and is formed with a region for the top electrode 20 with increased thickness on the outer side of the top electrode 4.

Figure 3:
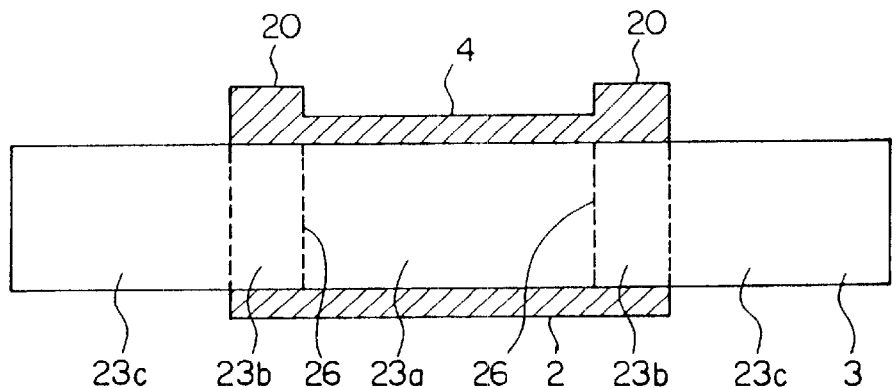
FIG. 3 is an enlarged view of an acoustic resonance portion shown in FIG. 2.

FIG. 3 is an enlarged view of the acoustic resonance portion 6 shown in FIG. 2. In FIG. 3, reference symbol 23a denotes a piezoelectric film of the thin top electrode 4 portion; 23b, a piezoelectric film of the thick top electrode 20 portion; 23c, a non-electrode portion piezoelectric film; and 26, a reflection surface of energy energy trapped resonance.

Figure 4:
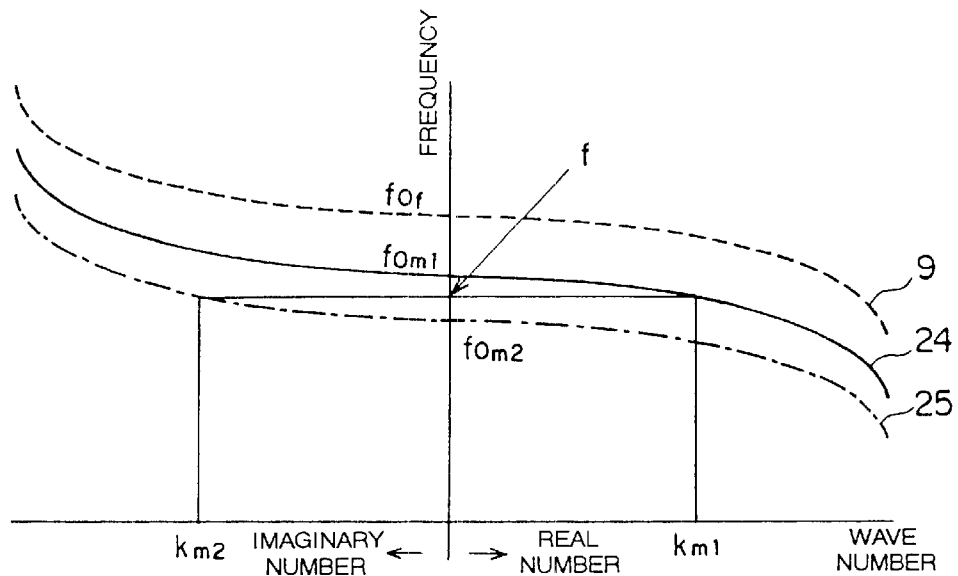
FIG. 4 is a graph showing a dispersion characteristic of the film bulk acoustic wave device shown in FIG. 3.

FIG. 4 is a graph showing a dispersion characteristic of the film bulk acoustic wave device illustrated in FIG. 3. In FIG. 4, reference symbol 24 denotes a dispersion characteristic of the thin top electrode portion piezoelectric film 23a and 25 denotes a dispersion characteristic of the thick top electrode portion piezoelectric film 23b.

The bottom electrode 2 of the film bulk acoustic wave device shown in FIG. 3 and the bottom electrode 2 of the film bulk acoustic wave device shown in FIG. 2 are different in structure from each other. However, the bottom electrode 2 shown in FIG. 3 is illustrated in a more simplified way and the actual thin film piezoelectric has the structure shown in FIG. 2.

Used for the piezoelectric film 3 is a material exhibiting a high-band-cut-off-type dispersion characteristic. For example, what exhibits the high-band-cut-off-type dispersion characteristic includes fundamental thickness longitudinal vibration of a piezoelectric film of which Poisson ratio σ is ⅓ or less, in addition to: fundamental thickness longitudinal vibration of lead titanate ($PbTiO_3$); ternary thickness shear vibration of lead zirconate titanate (PZT); and fundamental thickness longitudinal vibration of lithium tantalate ($LiTaO_3$) Z plate. These piezoelectric bodies exhibit extremely large electromechanical coupling coefficient, leading to realization of better device performance as compared with the conventional piezoelectric device that uses zinc oxide (ZnO) or aluminum nitride (AlN). Incidentally, Poisson ratio σ is one of the material constants that indicate a characteristic of a piezoelectric material, and is explained in detail in "Acoustic Wave Device Technology Handbook" edited by the 150th Committee of the Acoustic Wave Device Technology, the Japan Society for the Promotion of Science, pp. 10–21, 1991 (hereinafter, referred to as Reference 8).

The cut-off frequency "$f_{0m1}$" of the thin top electrode portion piezoelectric film 23a is lower than the cut-off frequency "$f_{0f}$" of the non-electrode portion piezoelectric film 23c because of the thickness and the mass load effect of the top electrode 4 and the bottom electrode 2.

When the electrode thickness of the region on the outer side of the top electrode 4 is increased to form the thick top electrode 20, owing to the thickness and the mass load effect of the top electrode 20, the cut-off frequency "$f_{0m2}$" of the thick top electrode portion piezoelectric film 23b is further lower than the cut-off frequency "$f_{0m1}$" of the thin top electrode portion piezoelectric film 23a.

Therefore, in the frequency band between the cut-off frequency "$f_{0m1}$" of the thin top electrode portion piezoelectric film 23a and the cut-off frequency "$f_{0m2}$" of the thick top electrode portion piezoelectric film 23b, a propagation band is formed within the thin top electrode portion piezoelectric film 23a and the rejection band is formed within the thick top electrode portion piezoelectric film 23b. The interface between the thin top electrode portion piezoelectric film 23a and the thick top electrode portion piezoelectric film 23b thus serves as the reflection surface 26 to confine energy of an acoustic wave, thereby realizing energy trapped resonance.

Accordingly, adopting such a structure makes it possible to realize energy trapping with the use of the piezoelectric film such as lead titanate ($PbTiO_3$), lead zirconate titanate (PZT) and lithium tantalate ($LiTaO_3$) which are large in electromechanical coupling coefficient. Thus may be realized a film bulk acoustic wave device of better device performance.

Embodiment 2

Figure 5:
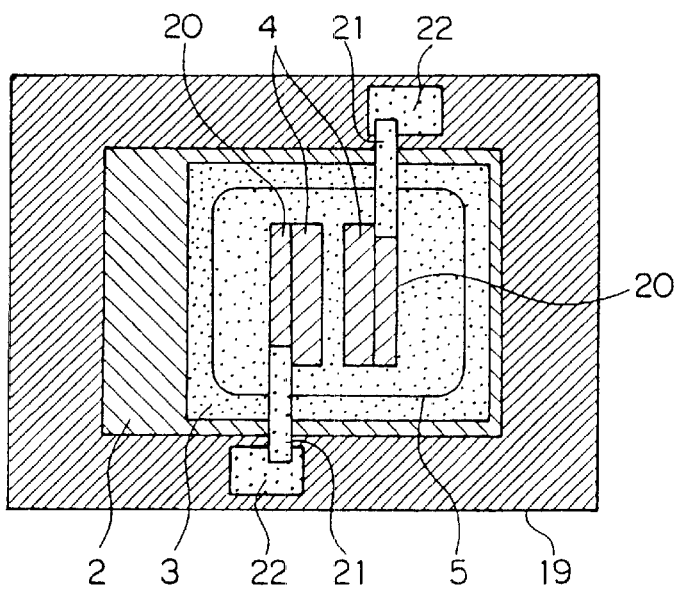
FIG. 5 is a view showing the top of a film bulk acoustic wave device according to Embodiment 2 of the present invention.
Figure 6:
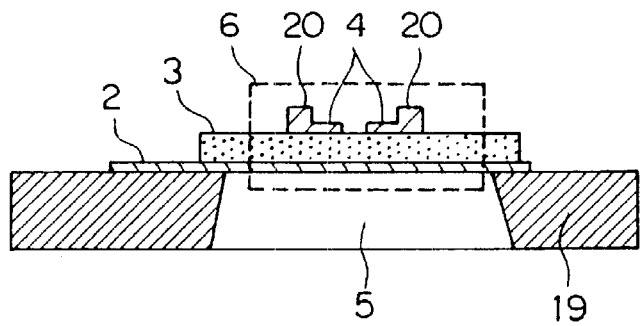
FIG. 6 is a view showing in section the film bulk acoustic wave device according to Embodiment 2 of the present invention.
Figure 7:
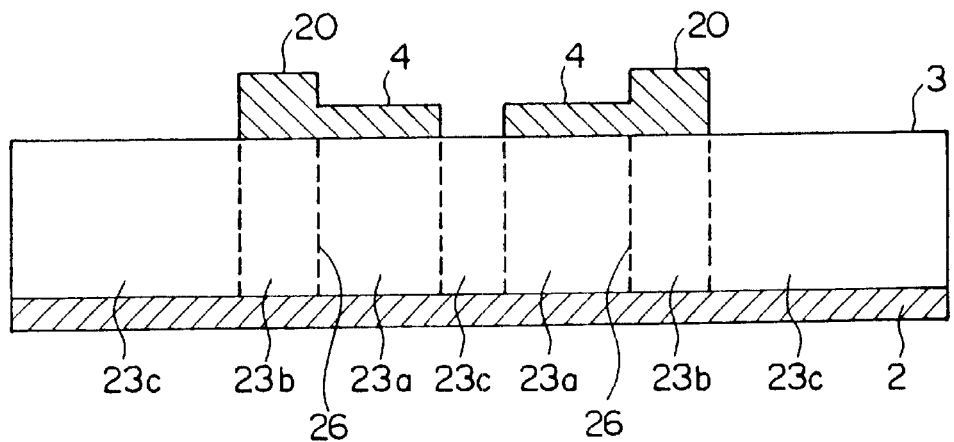
FIG. 7 is an enlarged view of an acoustic resonance portion shown in FIG. 6.

A description will be made with reference to FIGS. 5 to 7 on a film bulk acoustic wave device according to Embodiment 2 of the present invention. FIG. 5 is a view showing the top of the film bulk acoustic wave device according to Embodiment 2 of the present invention. FIG. 6 is a view showing in section the film bulk acoustic wave device according to Embodiment 2 of the present invention. FIG. 7 is a view showing in a magnifying manner an acoustic resonance portion illustrated in FIG. 6. This film bulk acoustic wave device according to Embodiment 2 is an example of a filter of two-electrode construction.

The dispersion characteristic of the film bulk acoustic wave device in FIG. 7 are the same as the dispersion characteristic shown in FIG. 4. The piezoelectric film 3 exhibits the high-band-cut-off-type dispersion characteristic, and the cut-off frequency "$f_{0m2}$" of the thick top electrode portion piezoelectric film 23b is lower than the cut-off frequency "$f_{0m1}$" of the thin top electrode portion piezoelectric film 23a.

Therefore, in the frequency band between the cut-off frequency "$f_{0m1}$" of the thin top electrode portion piezoelectric film 23a and the cut-off frequency "$f_{0m2}$" of the thick top electrode portion piezoelectric film 23b, a propagation band is formed within the thin top electrode portion piezoelectric film 23a and the rejection band is formed within the thick top electrode portion piezoelectric film 23b. The interface between the thin top electrode portion piezoelectric film 23a and the piezoelectric film 23b of the thick top electrode portion thus serves as the reflection surface 26 to confine energy of an acoustic wave, thereby realizing energy trapped resonance.

In energy trapped resonance, resonance is produced in a direction parallel to the surface of the piezoelectric film 3 to produce, in the case of the filter with the top electrode 4 being separated into two, symmetric mode resonance with which two top electrodes 4 have the same potential and asymmetric mode resonance with which the electrodes 4 have polarity opposite to each other. When a resonant frequency for producing the symmetric mode resonance and a resonant frequency for producing the asymmetric mode resonance are close to each other, coupling takes place between two top electrodes 4 to exhibit a filter characteristic.

Resonance frequencies for two resonance modes depend on the kind of the piezoelectric film 3 to be used, the space between the top electrodes 4, the physical dimensions of the thin top electrodes 4, the physical dimension of the thick top electrode 20 and a material for the electrodes. The filter operation when the energy trapping is used is described in detail in Reference 3.

In the case of the filter, if energy trapped resonance is not produced, insertion loss could be increased and spurious energy could be produced outside of the preferred bandwidth. However, the use of the film bulk acoustic wave device as shown in FIG. 7 may realize energy trapped resonance to allow to use the piezoelectric film that is large in electromechanical coupling coefficient, and may realize as well a film bulk acoustic wave device lesser in loss and better in characteristic.

Embodiment 3

Figure 8:
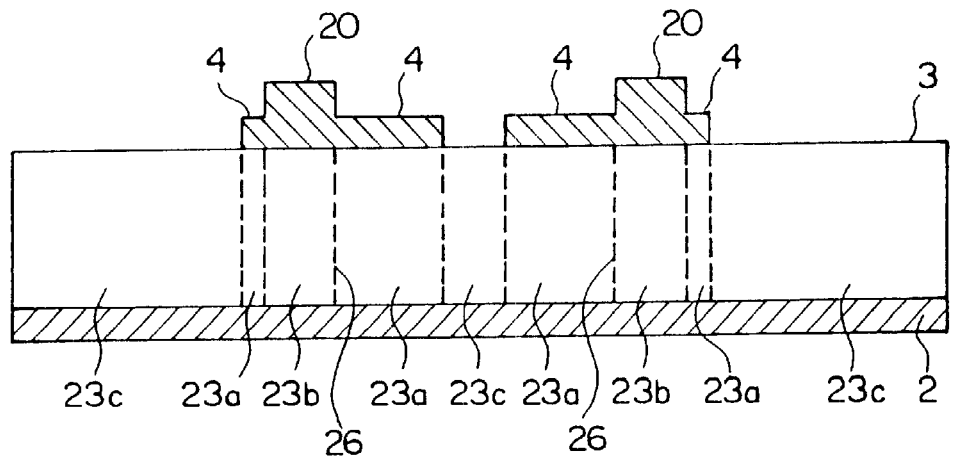
FIG. 8 is a view showing a film bulk acoustic wave device according to Embodiment 3 of the present invention.

A description will be made with reference to FIG. 8 on a film bulk acoustic wave device according to Embodiment 3 of the present invention. FIG. 8 is a view showing in a magnifying manner an acoustic resonance portion of the film bulk acoustic wave device according to Embodiment 3 of the present invention. Other constructions of the film bulk acoustic wave device according to Embodiment 3 are the same as those in Embodiment 2.

Unlike the case of Embodiment 2 shown in FIG. 7, the electrode thickness of a portion on the outer side of the top electrode 4 is the same as that of the thin top electrode 4. Energy trapped resonance is produced on the inner side to the reflection surface 26, and hence the film bulk acoustic wave device shown in FIG. 8 performs in principle the same operation as the film bulk acoustic wave device shown in FIG. 7 regardless of energy trapped resonance, even with the presence of the thin top electrode 4 outside the reflection surface 26.

In order to partially increase the electrode thickness of the top electrode 4 as shown in FIGS. 3, 7 and 8, there are a method in which a top electrode with the thickness of the thick top electrode 20 is formed in advance to thereafter form the thin top electrode 4 by a measure such as etching, and a method in which the thin top electrode 4 is first formed to then additionally form an electrode on the top electrode to be the thick top electrode through the lift-off method or the like. Any of these methods may be applied to the film bulk acoustic wave device according to Embodiment 3.

Embodiment 4

Figure 9:
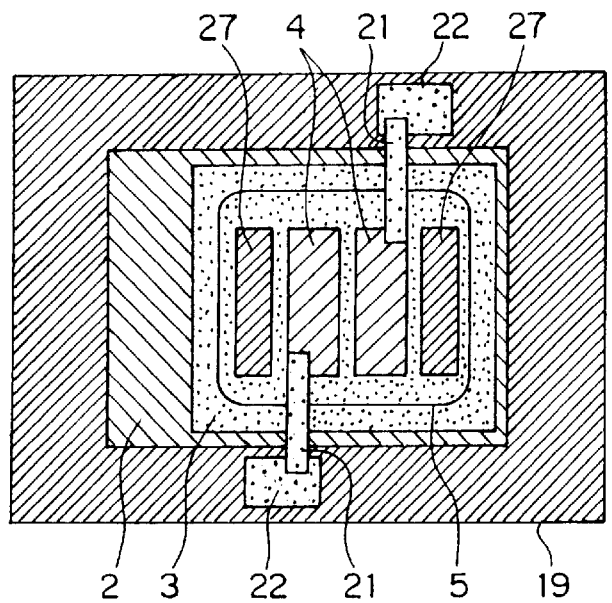
FIG. 9 is a view showing the top of a film bulk acoustic wave device according to Embodiment 4 of the present invention.
Figure 10:
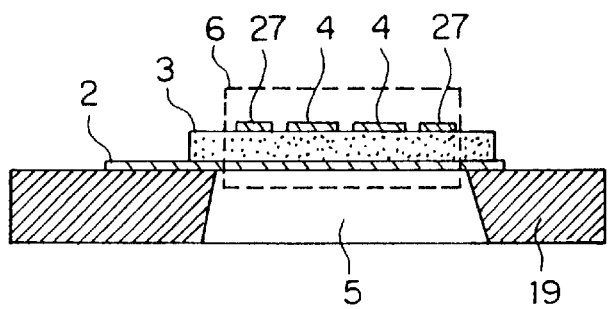
FIG. 10 is a view showing in section the film bulk acoustic wave device according to Embodiment 4 of the present invention.

A description will be made with reference to FIGS. 9 to 12 on a film bulk acoustic wave device according to Embodiment 4 of the present invention. FIG. 9 is a view showing the top of the film bulk acoustic wave device according to Embodiment 4 of the present invention. FIG. 10 is a view showing in section the film bulk acoustic wave device according to Embodiment 4 of the present invention.

In FIGS. 9 and 10, reference symbol 4 denotes a first top electrode and reference symbol 27 denotes a second top electrode.

Figure 11:
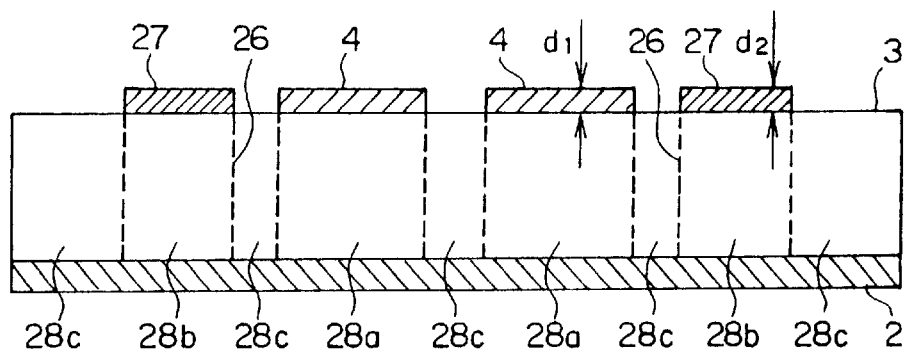
FIG. 11 is an enlarged view of an acoustic resonance portion shown in FIG. 10.

FIG. 11 is a view showing in a magnifying manner an acoustic resonance portion illustrated in FIG. 10. In FIG. 11, reference symbol 28a denotes a piezoelectric film of the first top electrode 4 portion; 28b, a piezoelectric film of the second top electrode 27 portion; and 28c, a non-electrode portion piezoelectric film.

Figure 12:
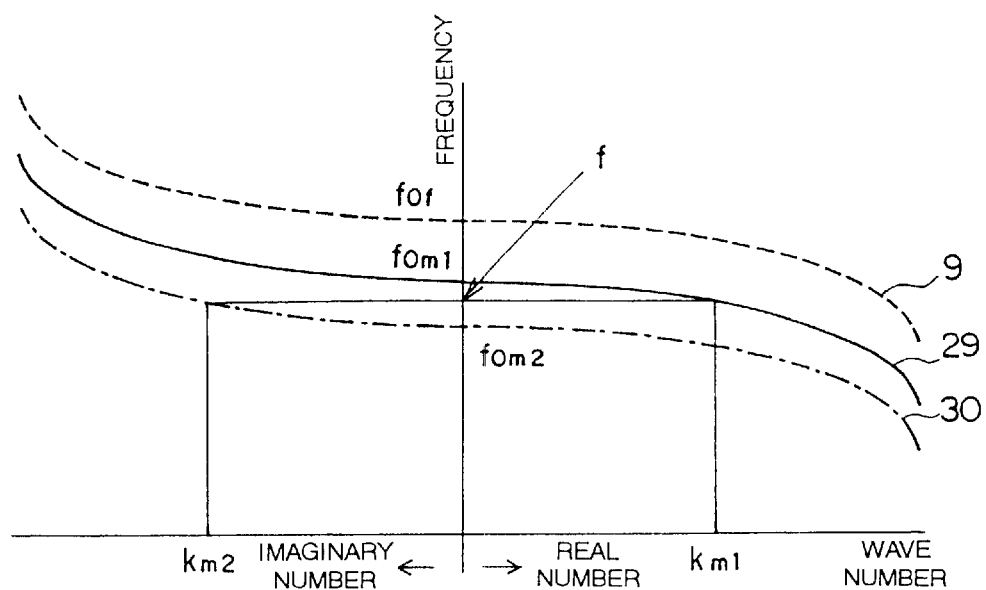
FIG. 12 is a graph showing a dispersion characteristic of the film bulk acoustic wave device shown in FIG. 11.

FIG. 12 is a graph showing a dispersion characteristic of the film bulk acoustic wave device illustrated in FIG. 11. In FIG. 12, reference symbol 29 denotes a dispersion characteristic of the first top electrode portion piezoelectric film 28a, and reference symbol 30 denotes a dispersion characteristic of the second top electrode portion piezoelectric film 28b.

The electrode thickness and the density of the first top electrode 4 are respectively given as "$d_1$" and "$\rho_1$", and the electrode thickness and the density of the second top electrode 27 are respectively given as "$d_2$" and "$\rho_2$". When the product of the electrode thickness "$d_2$" of the second top electrode 27 and the density "$\rho_2$" thereof ($d_2\rho_2$) is larger than the product of the electrode thickness "$d_1$" of the first top electrode 4 and the density "$\rho_1$" thereof ($d_1\rho_1$), the cut-off frequency "$f_{0m2}$" of the second top electrode portion piezoelectric film 28b is lower than the cut-off frequency "$f_{0m1}$" of the first top electrode portion piezoelectric film 28a.

Therefore, energy trapping may be realized in the frequency band between the the cut-off frequency "$f_{0m1}$" of the first top electrode portion piezoelectric film 28a and the cut-off frequency "$f_{0m2}$" of the second top electrode portion piezoelectric film 28b to realize a film bulk acoustic wave device of good performance.

In the case that the second top electrode 27 is made of the same material as the first top electrode 4, the electrode thickness "$d_2$" of the second top electrode 27 needs to be thicker than the electrode thickness "$d_1$" of the first top electrode 4.

On the other hand, with the use of different materials, when, for instance, the second top electrode 27 has a density larger than that of the first top electrode 4, the electrode thickness "$d_2$" of the second top electrode 27 may be equal to or thinner than the electrode thickness "$d_1$" of the first top electrode 4.

Embodiment 5

Figure 13:
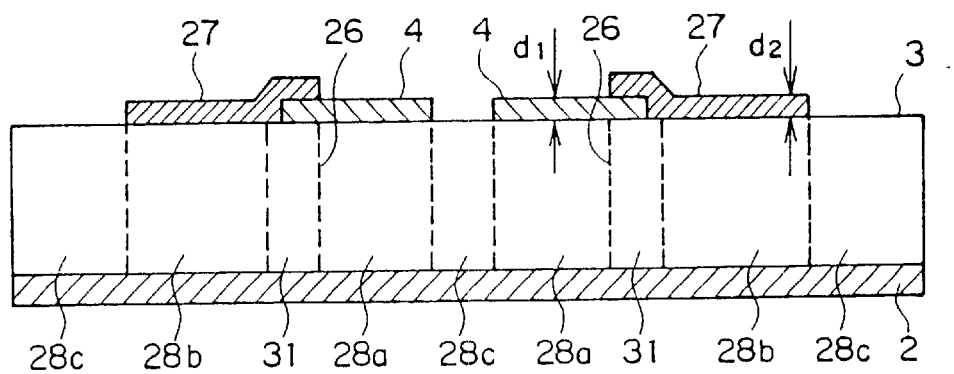
FIG. 13 is a view showing a film bulk acoustic wave device according to Embodiment 5 of the present invention.
Figure 14:
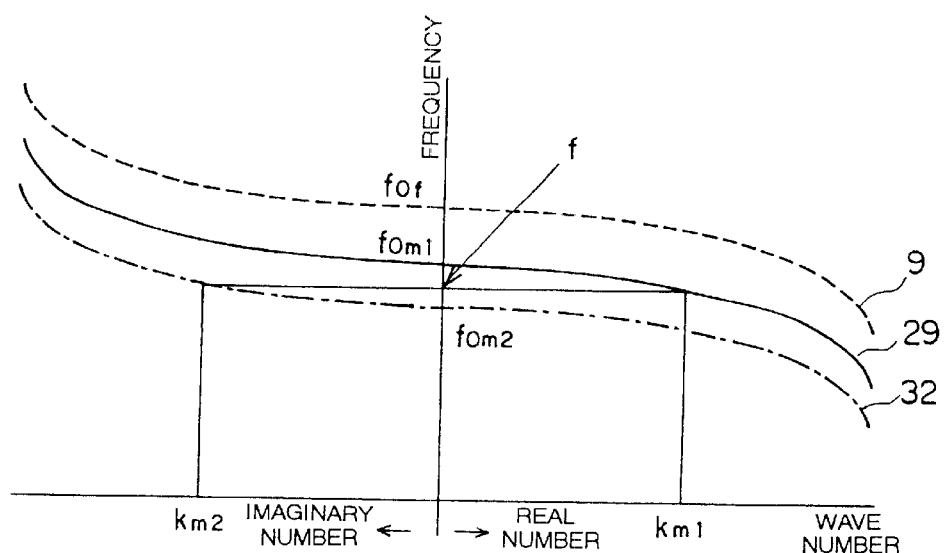
FIG. 14 is a graph showing a dispersion characteristic of the film bulk acoustic wave device illustrated in FIG. 13.

A description will be made with reference to FIGS. 13 and 14 on a film bulk acoustic wave device according to Embodiment 5 of the present invention. FIG. 13 is a view showing in a magnifying manner an acoustic resonance portion of the film bulk acoustic wave device according to Embodiment 5 of the present invention. FIG. 14 is a graph showing a dispersion characteristic of the film bulk acoustic wave device illustrated in FIG. 13. Other constructions of the film bulk acoustic wave device according to Embodiment 5 are the same as those in Embodiment 4.

In FIG. 13, reference symbol 31 denotes a piezoelectric film of a region where the first top electrode 4 and the second top electrode 27 overlap with each other.

In FIG. 14, reference symbol 32 denotes a dispersion characteristic of the piezoelectric film 31 of the region where the first and second electrodes overlap each other.

In the film bulk acoustic wave device shown in FIG. 13, the reflection surface 26 of energy trapped resonance corresponds to the surface below the end surface of the second top electrode 27 overlapping the first top electrode 4. The cut-off frequency "$f_{0m2}$" of the piezoelectric film 31 of the region where the first and second electrodes overlap each other is a lower frequency than the cut-off frequency "$f_{0m1}$" of the first top electrode portion piezoelectric film 28a, owing to both the electrode thickness "$d_1$" plus the mass load effect of the first top electrode 4 and the electrode thickness "$d_2$" plus the mass load effect of the second top electrode 27.

Therefore, energy trapping takes place in the frequency band between the cut-off frequency "$f_{0m1}$" of the first top electrode portion piezoelectric film 28a and the cut-off frequency "$f_{0m2}$" of the piezoelectric film 31 of the region where the first and second electrodes overlap each other. That is, filter operation by energy trapping may be realized.

In the film bulk acoustic wave device shown in FIG. 13, it is sufficient that the electrode thickness "$d_2$" and the density "$\rho_2$" of the second top electrode 27 can lower the cut-off frequency "$f_{0m2}$" of the piezoelectric film 31 of the region where the first and second electrodes overlap each other to the degree required for filter operation, and the limitation put on the electrode thickness "$d_1$" and the density "$\rho_1$" of the first top electrode 4 is less strict than in the case shown in FIG. 11. This is because of the structure in which the second top electrode 27 overlaps the first top electrode 4.

Embodiment 6

Figure 15:
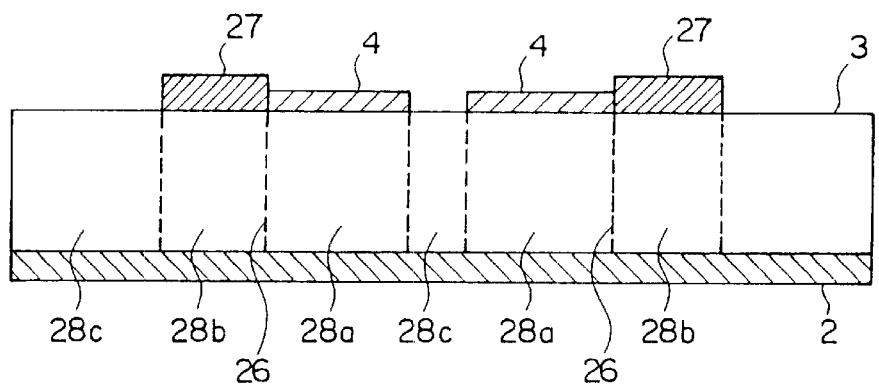
FIG. 15 is a view showing a film bulk acoustic wave device according to Embodiment 6 of the present invention.

A description will be made with reference to FIG. 15 on a film bulk acoustic wave device according to Embodiment 6 of the present invention. FIG. 15 is a view showing in a magnifying manner an acoustic resonance portion of the film bulk acoustic wave device according to Embodiment 6 of the present invention. Other constructions of the film bulk acoustic wave device according to Embodiment 6 are the same as those in Embodiment 4.

The film bulk acoustic wave device shown in FIG. 15 corresponds to the first top electrode 4 and the second top electrode 27 in the film bulk acoustic wave device shown in FIG. 11, which are connected with each other. Accordingly, operation principle of energy trapping is the same as in the case of the piezoelectric film shown in FIG. 11.

The mass load by the second top electrode 27 is thus required to be larger than the mass load by the first top electrode 4. In other words, the product of the electrode thickness "$d_2$" of the second top electrode 27 and the density "$\rho_2$" thereof ($d_2\rho_2$) needs to be larger than the product of the electrode thickness "$d_1$" of the first top electrode 4 and the density "$\rho_1$" thereof ($d_1\rho_1$).

At this time, in the case that the first top electrode 4 and the second top electrode 27 are made of the same material to have the same density, the electrode thickness "$d_2$" of the second top electrode 27 is necessarily larger than the electrode thickness "$d_1$" of the first top electrode 4, obtaining the same structure as that of the piezoelectric film according to Embodiment 2 shown in FIG. 7.

Embodiment 7

Figure 16:
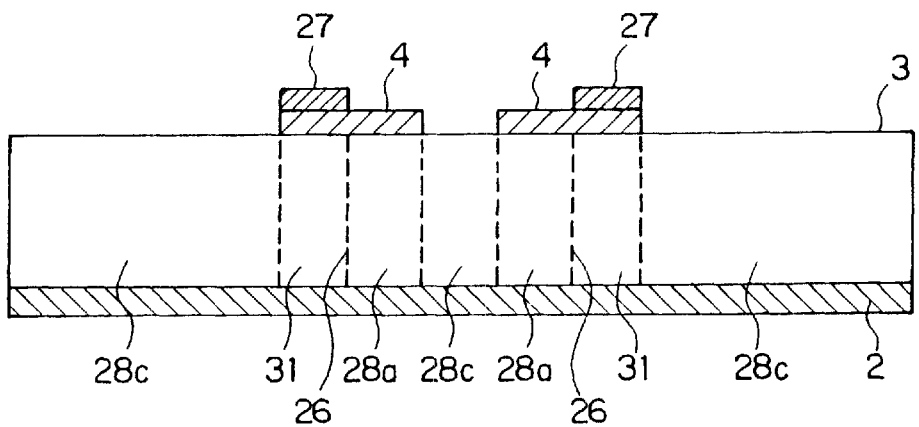
FIG. 16 is a view showing a film bulk acoustic wave device according to Embodiment 7 of the present invention.

A description will be made with reference to FIG. 16 on a film bulk acoustic wave device according to Embodiment 7 of the present invention. FIG. 16 is a view showing in a magnifying manner an acoustic resonance portion of the film bulk acoustic wave device according to Embodiment 7 of the present invention. Other constructions of the film bulk acoustic wave device according to Embodiment 7 are the same as those in Embodiment 4.

This Embodiment 7 employs the structure in which the whole second top electrode 27 is laid on the top electrode 4. Since the dispersion characteristic of the portion where the second top electrode 27 is laid on the first top electrode 4 are the same as the dispersion characteristic shown in FIG. 14, the operation principle of energy trapping is almost the same as in the case of the film bulk acoustic wave device according to Embodiment 5 shown in FIG. 13.

Therefore in the film bulk acoustic wave device shown in FIG. 16, as in the case shown in FIG. 13, it is sufficient that the electrode thickness "$d_2$" and the density "$\rho_2$" of the second top electrode 27 can lower the cut-off frequency "$f_{0m2}$" of the piezoelectric film 31 of the region where the first and second electrodes overlap each other to the degree required for filter operation, and the limitation put on the electrode thickness "$d_1$" and the density "$\rho_1$" of the first top electrode 4 is less strict than in the case of Embodiment 6 shown in FIG. 15. This is because of the structure in which the second top electrode 27 is laid on the first top electrode 4.

Embodiment 8

Figure 17:
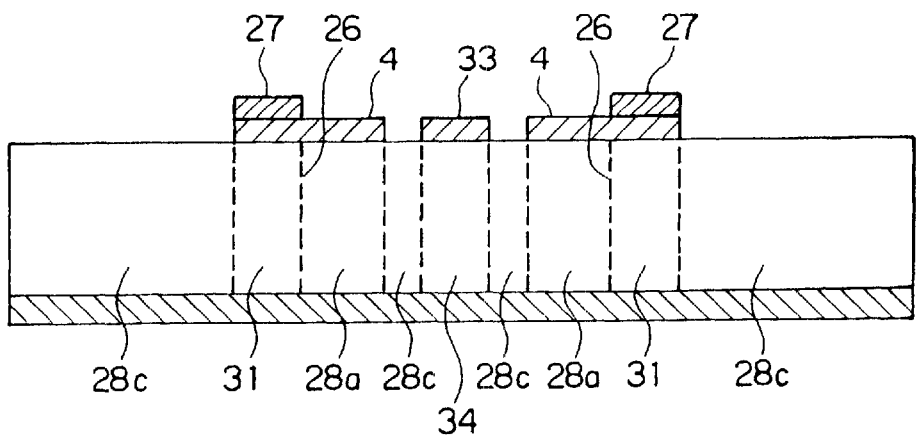
FIG. 17 is a view showing a film bulk acoustic wave device according to Embodiment 8 of the present invention.

A description will be made with reference to FIG. 17 on a film bulk acoustic wave device according to Embodiment 8 of the present invention. FIG. 17 is a view showing in a magnifying manner an acoustic resonance portion of the film bulk acoustic wave device according to Embodiment 8 of the present invention. Other constructions of the film bulk acoustic wave device according to Embodiment 8 are the same as those in Embodiment 7.

In FIG. 17, reference symbol 33 denotes a third top electrode and reference symbol 34 denotes a third top electrode portion piezoelectric film.

The third top electrode 33 is inserted to improve the degree of freedom in designing the filter characteristic in the film bulk acoustic wave device. The dispersion characteristic of this third top electrode portion piezoelectric film 34 is close to the dispersion characteristic of the first top electrode portion piezoelectric film 28a. Namely, the cut-off frequency "$f_{0m3}$" of the third top electrode portion piezoelectric film 34 may be considered as being close to the cut-off frequency "$f_{0m1}$" of the first top electrode portion e piezoelectric film 28a.

Accordingly, the dispersion characteristic of the piezoelectric film shown in FIG. 17 may be deduced with the use of FIG. 14. That is, the reflection surface 26 of energy trapping corresponds to the surface below and on the inner side to the end surface of the second top electrode 27 overlapping the first top electrode 4.

The present invention is not limited to lead titanate ($PbTiO_3$), lead zirconate titanate (PZT), lithium tantalate ($LiTaO_3$) and a piezoelectric film with Poisson ratio $\sigma$ of $\frac{1}{3}$ or less, but may be applied to all the piezoelectric bodies that exhibit the high-band-cut-off-type dispersion characteristic.

The methods shown in FIGS. 11, 13, 15 and 16 may be applied to the resonator shown in FIGS. 1 and 2.

The methods shown in FIGS. 7, 8, 11, 13, 15 and 16 may be applied, as shown in FIG. 17, to the case in which the film bulk acoustic wave device consists of more electrodes than in the two-electrode construction.

Though the air bridge 21 is used to fetch an electric signal from the top electrode 4 in FIGS. 1, 2 and 3, the way how to fetch the electric signal from the top electrode 4 is not necessarily limited to the air bridge 21, but may be a method of constructing a line on the surface of the piezoelectric film 3 or other arbitrary methods.

The via hole 5 shown is pierced from the back surface of the semiconductor substrate 19, but is not necessarily limited thereto. It makes no difference when the via hole is formed through a method in which an aperture is formed below the acoustic resonance portion 6 through anisotropic etching or the like starting from the front surface of the semiconductor substrate 19, a method in which a layer-like aperture is formed by removing a previously prepared thin film with etching or the like, or a method in which several layers that are different in acoustical property with one another are layered so that an acoustic wave propagating along the thickness direction is reflected on that multi-layer structure.

Subsequently, a description will be made on a film bulk acoustic wave device provided with a dielectric on the top of the top electrode or the like in Embodiments 9 to 15 below.

Embodiment 9

Figure 18:
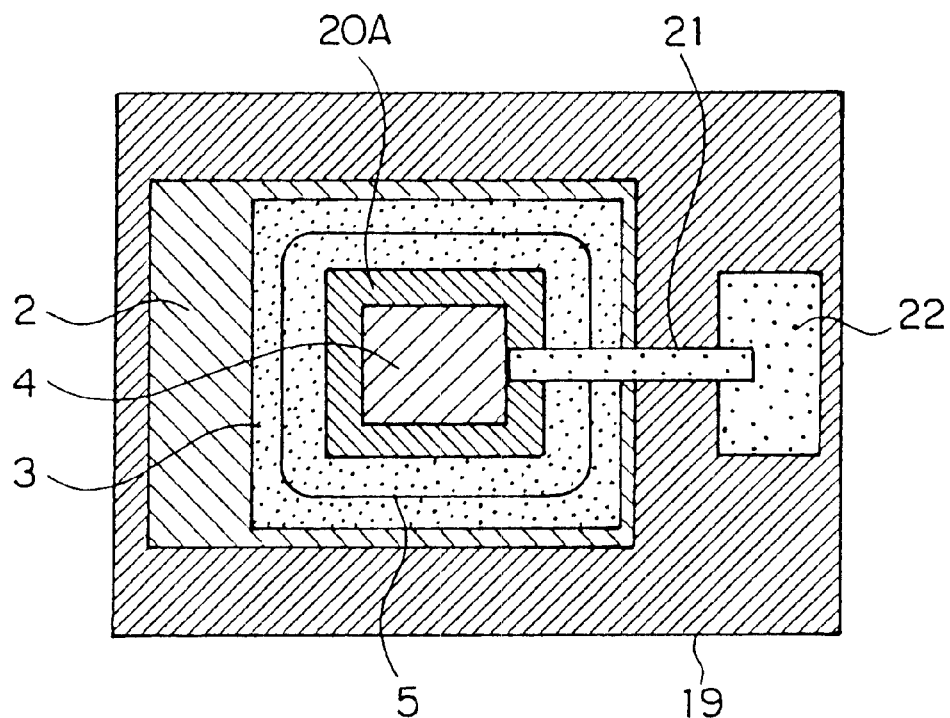
FIG. 18 is a view showing the top of a film bulk acoustic wave device according to Embodiment 9 of the present invention.
Figure 19:
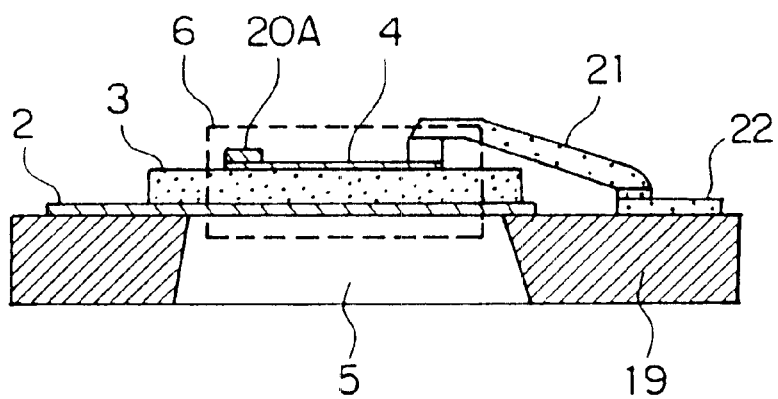
FIG. 19 is a view showing in section the film bulk acoustic wave device according to Embodiment 9 of the present invention.

A description will be made with reference to FIGS. 18 to 21 on a film bulk acoustic wave device according to Embodiment 9 of the present invention. FIG. 18 is a view showing the top of the film bulk acoustic wave device according to Embodiment 9 of the present invention. FIG. 19 is a view showing in section the film bulk acoustic wave device according to Embodiment 9 of the present invention. In the drawings, identical symbols denote identical or corresponding portions.

In FIGS. 18 and 19, reference symbol 19 denotes a semiconductor substrate or a dielectric substrate; 2, a bottom electrode; 3, a piezoelectric film; 4, a top electrode; 5, a via hole; 6, an acoustic resonance portion; 20A, a dielectric; 21, an air bridge; and 22, a pad.

The semiconductor substrate or dielectric substrate 19, as it does not have direct influence on an acoustical characteristic of the film bulk acoustic wave device, may be either a conventionally used semiconductor substrate such as a silicon (Si) semiconductor substrate and a gallium arsenic (GaAs) semiconductor substrate, or an insulating dielectric substrate having no semiconductor characteristic such as a glass, sapphire or magnesium oxide (MgO) substrate. The silicon (Si) substrate, the gallium arsenic (GaAs) substrate and the magnesium oxide (MgO) substrate in particular have good characteristic in high-temperature resistance and are excellent substrate materials. Hereinafter, the semiconductor substrate or dielectric substrate 19 is generically referred to as the semiconductor substrate 19.

The bottom electrode 2 is formed on this semiconductor substrate 19. In some cases, a dielectric layer made of silicon oxide (SiO, SiO$_2$), silicon nitride (SiN) or the like may be inserted between the semiconductor substrate 19 and the bottom electrode 2. This may be applied to all Embodiments shown below. On the bottom electrode 2, the piezoelectric film 3 is formed and the top electrode 4 is further formed on the piezoelectric film 3.

Though the air bridge 21 is used to electrically connect the top electrode 4 and the pad 22, the electrode may sometimes be connected to the pad 22 using a line adhered to the surface of the piezoelectric film 3.

The via hole 5 is formed from the back surface of the semiconductor substrate 19 to obtain a structure in which the bottom surface of the bottom electrode 2 is exposed to the air. In the case that the dielectric layer described above is inserted, there is the choice between removing also the dielectric layer so that the bottom surface of the bottom electrode 2 is exposed to the air and exposing to the air the bottom surface of the dielectric layer. Those structures are the same as in film bulk acoustic wave devices of the prior art.

However, this film bulk acoustic wave device according to Embodiment 9 uses for the piezoelectric film 3 a material having a high-band-cut-off-type dispersion characteristic, and is formed with a region for the dielectric 20A on the outer side of the top electrode 4.

Figure 20:
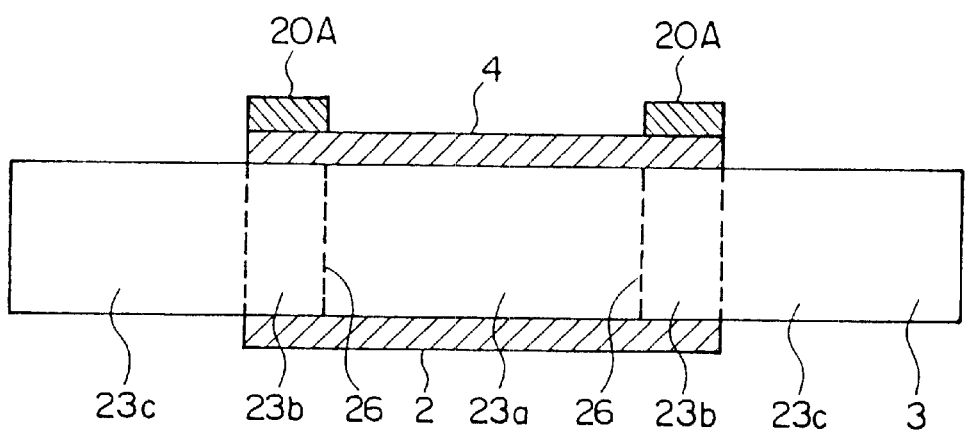
FIG. 20 is an enlarged view of an acoustic resonance portion shown in FIG. 19.

FIG. 20 is an enlarged view of the acoustic resonance portion 6 shown in FIG. 19. In FIG. 20, reference symbol 23a denotes a piezoelectric film of the top electrode 4 portion; 23b, a piezoelectric film of the dielectric 20A portion; 23c, a non-electrode portion piezoelectric film; and 26, a reflection surface of energy trapped resonance.

Figure 21:
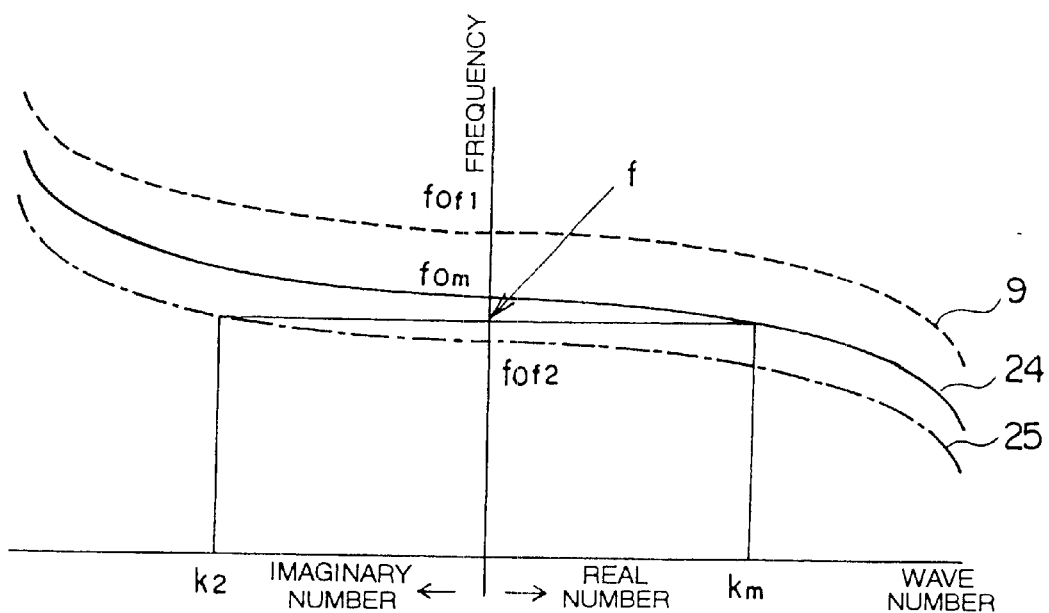
FIG. 21 is a graph showing a dispersion characteristic of the film bulk acoustic wave device illustrated in FIG. 20.

FIG. 21 is a graph showing a dispersion characteristic of the film bulk acoustic wave device illustrated in FIG. 20. In the drawing, reference symbol 24 denotes a dispersion characteristic of the top electrode portion piezoelectric film 23a, and reference symbol 25 denotes a dispersion characteristic of the dielectric portion piezoelectric film 23b.

The bottom electrode 2 of the film bulk acoustic wave device shown in FIG. 20 and the bottom electrode 2 of the film bulk acoustic wave device shown in FIG. 19 are different in structure from each other. However, the bottom electrode 2 shown in FIG. 20 is illustrated in a more simplified way. In the film bulk acoustic wave device shown in FIG. 19, the air bridge 21 and the top electrode 4 are electrically connected with each other and the dielectric 20A is not present between the air bridge 21 and the top electrode 4. The dielectric 20A, on the other hand, seems to be present in FIG. 20. The actual thin film piezoelectric has the structure shown in FIG. 19.

Used for the piezoelectric film 3 is a material exhibiting the high-band-cut-off-type dispersion characteristic. For example, what exhibits the high-band-cut-off-type dispersion characteristic includes fundamental thickness longitudinal vibration of a piezoelectric film of which Poisson ratio σ is ⅓ or less, in addition to: fundamental thickness longitudinal vibration of lead titanate (PbTiO$_3$); ternary thickness shear vibration of lead zirconate titanate (PZT); and fundamental thickness longitudinal vibration of lithium tantalate (LiTaO$_3$) Z plate. These piezoelectric bodies exhibit extremely large electromechanical coupling coefficient, leading to realization of better device performance as compared with a conventional piezoelectric device that uses zinc oxide (ZnO) or aluminum nitride (AlN). Incidentally, Poisson ratio o is one of the material constants that indicate a characteristic of a piezoelectric material, and is explained in detail in, for example, "Acoustic Wave Device Technology Handbook" edited by the 150th Committee of the Acoustic Wave Device Technology, the Japan Society for the Promotion of Science, pp. 10–21, 1991 (Reference 8).

The cut-off frequency "$f_{0m}$" of the top electrode portion piezoelectric film 23a is lower than the cut-off frequency "$f_{0f1}$" of the non-electrode portion piezoelectric film 23c because of the thickness and the mass load effect of the top electrode 4 and the bottom electrode 2.

When the dielectric 20A is formed in the region above the top electrode 4, owing to the thickness and the mass load effect of the top electrode 4 and the dielectric 20A, the cut-off frequency "$f_{0f2}$" of the dielectric portion piezoelectric film 23b is further lower than the cut-off frequency "$f_{0m}$" of the top electrode portion piezoelectric film 23a.

Therefore, in the frequency band between the cut-off frequency "$f_{0m}$" of the top electrode portion piezoelectric film 23a and the cut-off frequency "$f_{0f2}$" of the dielectric portion piezoelectric film 23b, a propagation band is formed within the top electrode portion piezoelectric film 23a and the rejection band is formed within the dielectric portion piezoelectric film 23b. The interface between the piezoelectric film 23a and the piezoelectric film 23b of the dielectric portion thus serves as the reflection surface 26 to confine energy of an acoustic wave, thereby realizing energy trapped resonance.

Accordingly, adopting such a structure makes it possible to realize energy trapping with the use of the piezoelectric film such as lead titanate (PbTiO$_3$), lead zirconate titanate (PZT) and lithium tantalate (LiTaO$_3$) which are large in electromechanical coupling coefficient. Thus may be realized a film bulk acoustic wave device of better device performance.

Embodiment 10

Figure 22:
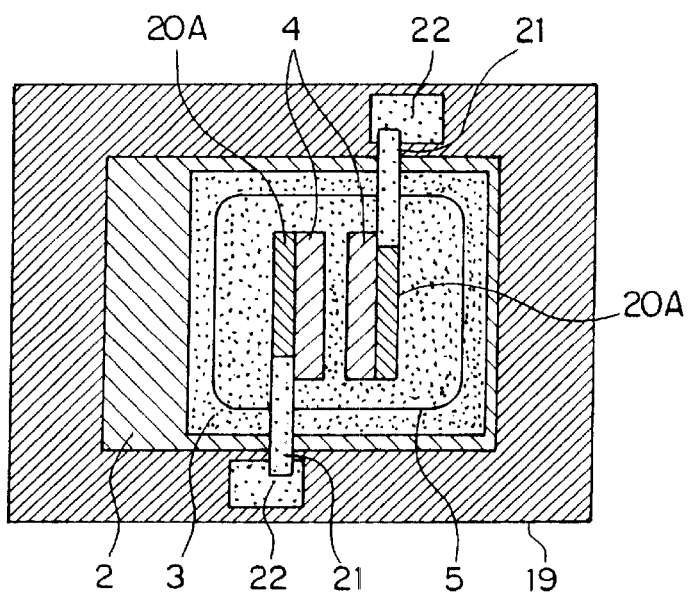
FIG. 22 is a view showing the top of a film bulk acoustic wave device according to Embodiment 10 of the present invention.
Figure 23:
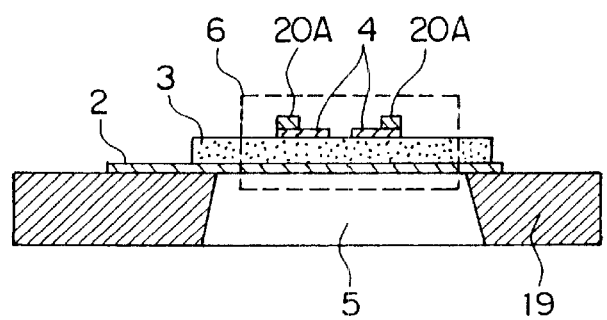
FIG. 23 is a view showing in section the film bulk acoustic wave device according to Embodiment 10 of the present invention.
Figure 24:
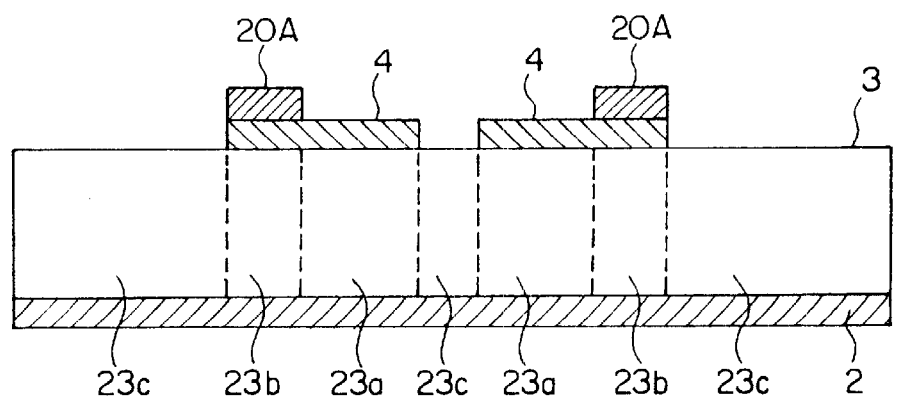
FIG. 24 is an enlarged view of an acoustic resonance portion shown in FIG. 23.

A description will be made with reference to FIGS. 22 to 24 on a film bulk acoustic wave device according to Embodiment 10 of the present invention. FIG. 22 is a view showing the top of the film bulk acoustic wave device according to Embodiment 10 of the present invention. FIG. 23 is a view showing in section the film bulk acoustic wave device according to Embodiment 10 of the present invention. FIG. 24 is a view showing in a magnifying manner an acoustic resonance portion illustrated in FIG. 23. This film bulk acoustic wave device according to Embodiment 10 is an example of a filter of two-electrode construction.

The dispersion characteristic of the film bulk acoustic wave device in FIG. 24 are the same as the dispersion characteristic shown in FIG. 21. The piezoelectric film 3 exhibits the high-band-cut-off-type dispersion characteristic, and the cut-off frequency "$f_{0/2}$" of the dielectric portion piezoelectric film 23b is lower than the cut-off frequency "$f_{0m}$" of the top electrode portion piezoelectric film 23a.

Therefore, in the frequency band between the cut-off frequency "$f_{0m}$" of the top electrode portion piezoelectric film 23a and the cut-off frequency "$f_{0/2}$" of the dielectric portion piezoelectric film 23b, a propagation band is formed within the top electrode portion piezoelectric film 23a and the rejection band is formed within the dielectric portion piezoelectric film 23b. The interface between the top electrode portion piezoelectric film 23a and the dielectric portion piezoelectric film 23b thus serves as the reflection surface 26 to confine energy of an acoustic wave, thereby realizing energy trapped resonance.

In energy trapped resonance, resonance is produced in a direction parallel to the surface of the piezoelectric film 3 to produce, in the case of the filter with the top electrode 4 being separated into two, symmetric mode resonance with which two top electrodes 4 have the same potential and asymmetric mode resonance with which the electrodes 4 have polarity opposite to each other. When a resonant frequency for producing the symmetric mode resonance and a resonant frequency for producing the asymmetric mode resonance are close to each other, coupling takes place between two top electrodes 4 to exhibit a filter characteristic.

Resonance frequencies for two resonance modes depend on the kind of the piezoelectric film 3 to be used, the space between the top electrodes 4, the physical dimensions of the top electrodes 4, the physical dimension of the dielectric 20A and materials for the electrodes and for the dielectric. The filter operation when the energy trapping is used is described in detail in Reference 3.

In the case of the filter, if energy trapped resonance is not produced, insertion loss could be increased and spurious energy could be produced outside of the preferred bandwidth. However, the use of the film bulk acoustic wave device as shown in FIG. 24 may realize energy trapped resonance to allow to use the piezoelectric film that is large in electromechanical coupling coefficient, and may realize as well a film bulk acoustic wave device lesser in loss and better in characteristic.

Embodiment 11

Figure 25:
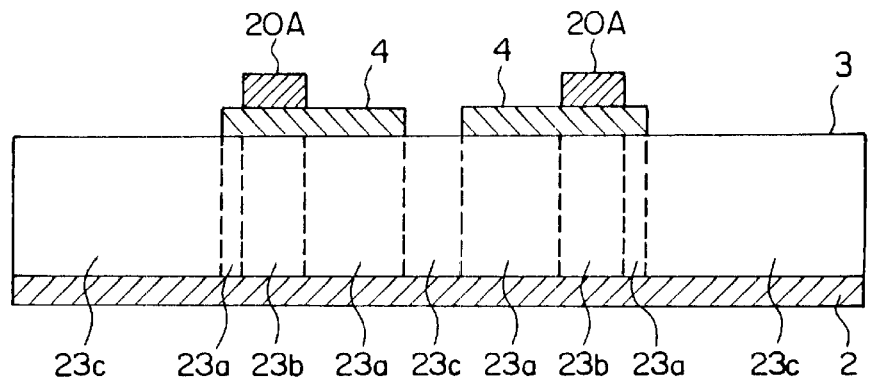
FIG. 25 is a view showing a film bulk acoustic wave device according to Embodiment 11 of the present invention.

A description will be made with reference to FIG. 25 on a film bulk acoustic wave device according to Embodiment 11 of the present invention. FIG. 25 is a view showing in a magnifying manner an acoustic resonance portion of the film bulk acoustic wave device according to Embodiment 11 of the present invention. Other constructions of the film bulk acoustic wave device according to Embodiment 11 are the same as those in Embodiment 10.

Unlike the case of Embodiment 10 shown in FIG. 24, the dielectric 20A is formed inside the outer end of the top electrode 4. Energy trapped resonance is produced on the inner side to the reflection surface 26, and hence the film bulk acoustic wave device shown in FIG. 25 performs in principle almost the same operation as the film bulk acoustic wave device shown in FIG. 24 regardless of energy trapped resonance, even with the presence of a region having no dielectric 20A outside the reflection surface 26.

In order to form the dielectric 20A on the top electrode 4 as shown in FIGS. 20, 24 and 25, there are methods in which the dielectric 20A is formed in advance on the entire top surface of the top electrode 4 to remove thereafter unnecessary dielectric 20A by a measure such as etching, and a method in which the top electrode 4 is first formed to then restrict through the lift-off method, masking or the like a region where the dielectric 20A is formed. Any of these methods may be applied to the film bulk acoustic wave device according to Embodiment 11.

The dielectric to be used may be of a silicon-based compound such as silicon oxide (SiO, SiO$_2$) and silicon nitride (SiN), a titanium-based compound such as titanium dioxide, or other dielectric. It will do as long as it is a dielectric that is suitable for combining with materials for the respective parts used in the film bulk acoustic wave device.

Embodiment 12

Figure 26:
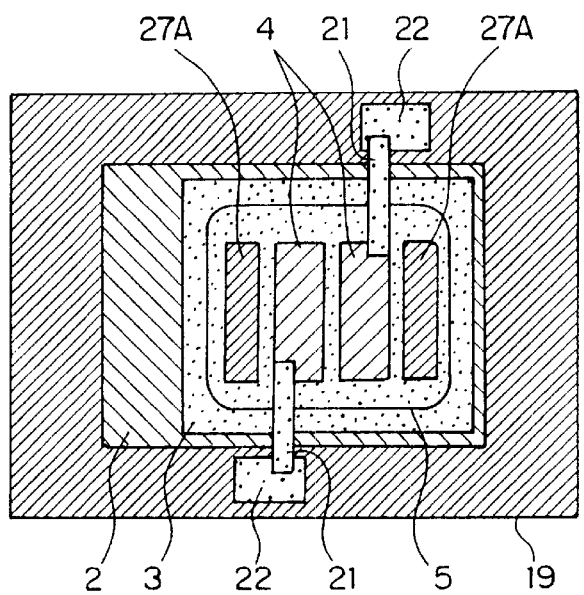
FIG. 26 is a view showing the top of a film bulk acoustic wave device according to Embodiment 12 of the present invention.
Figure 27:
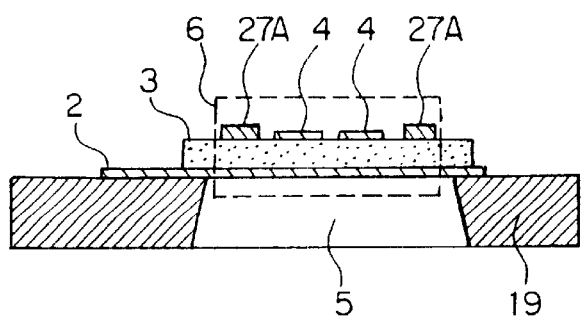
FIG. 27 is a view showing in section the film bulk acoustic wave device according to Embodiment 12 of the present invention.

A description will be made with reference to FIGS. 26 to 29 on a film bulk acoustic wave device according to Embodiment 12 of the present invention. FIG. 26 is a view showing the top of the film bulk acoustic wave device according to Embodiment 12 of the present invention. FIG. 27 is a view showing in section the film bulk acoustic wave device according to Embodiment 12 of the present invention.

In FIGS. 26 and 27, reference symbol 4 denotes a top electrode, and reference symbol 27A denotes a dielectric.

Figure 28:
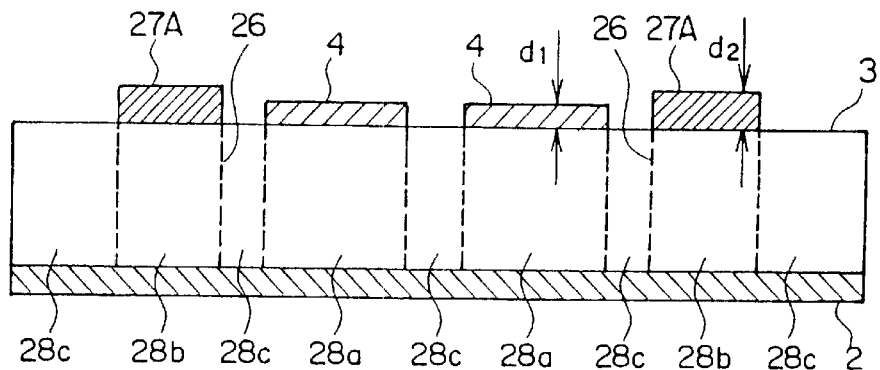
FIG. 28 is an enlarged view of an acoustic resonance portion illustrated in FIG. 27.

FIG. 28 is a view showing in a magnifying manner an acoustic resonance portion illustrated in FIG. 27. In FIG. 28, reference symbol 28a denotes a piezoelectric film of the top electrode 4 portion; 28b, a piezoelectric film of the dielectric 27A portion; and 28c, a non-electrode portion piezoelectric film.

Figure 29:
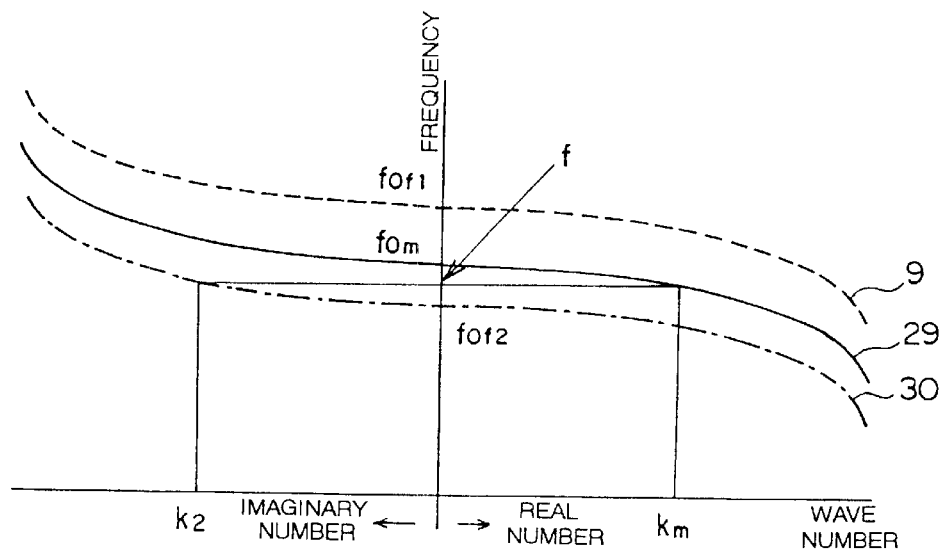
FIG. 29 is a graph showing a dispersion characteristic of the film bulk acoustic wave device shown in FIG. 28.

FIG. 29 is a graph showing a dispersion characteristic of the film bulk acoustic wave device illustrated in FIG. 28. In FIG. 29, reference symbol 29 denotes a dispersion characteristic of the top electrode portion piezoelectric film 28a, and reference symbol 30 denotes a dispersion characteristic of the dielectric portion piezoelectric film 28b.

The electrode thickness and the density of the top electrode 4 are respectively given as "$d_1$" and "$\rho_1$", and the film thickness and the density of the dielectric 27A are respectively given as "$d_2$" and "$\rho_2$". When the product of the film thickness "$d_2$" of the dielectric 27A and the density "$\rho_2$" thereof ($d_2\rho_2$) is larger than the product of the electrode thickness "$d_1$" of the top electrode 4 and the density "$\rho_1$" thereof ($d_1\rho_1$), the cut-off frequency "$f_{0/2}$" of the dielectric portion piezoelectric film 28b is lower than the cut-off frequency "$f_{0m}$" of the top electrode portion piezoelectric film 28a.

Therefore, energy trapping may be realized in the frequency band between the cut-off frequency "$f_{0m}$" of the top electrode portion piezoelectric film 28a and the cut-off frequency "$f_{0f2}$" of the dielectric portion piezoelectric film 28b to realize a film bulk acoustic wave device of good performance.

Embodiment 13

Figure 30:
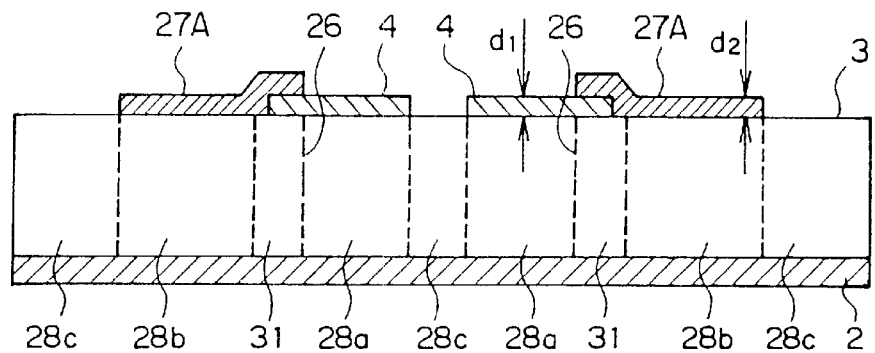
FIG. 30 is a view showing a film bulk acoustic wave device according to Embodiment 13 of the present invention.
Figure 31:
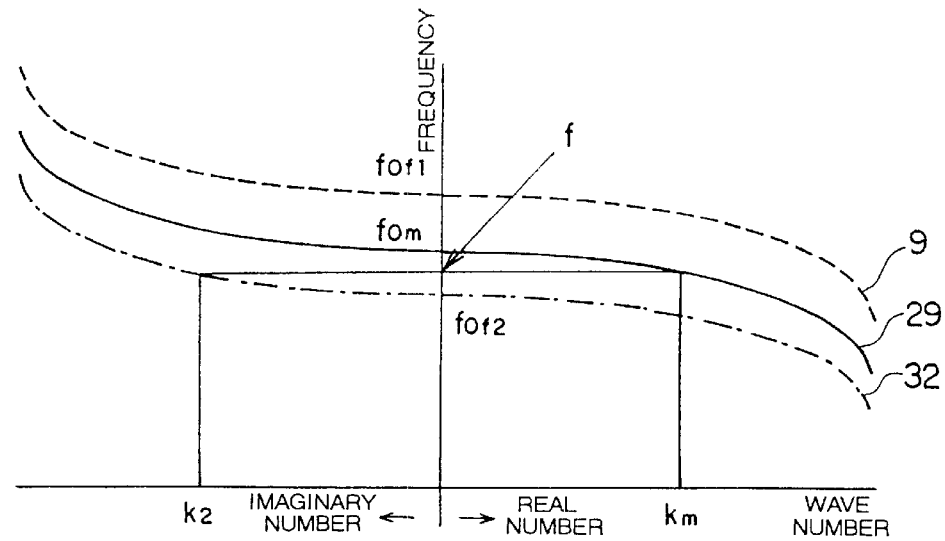
FIG. 31 is a graph showing a dispersion characteristic of the film bulk acoustic wave device illustrated in FIG. 30.

A description will be made with reference to FIGS. 30 and 31 on a film bulk acoustic wave device according to Embodiment 13 of the present invention. FIG. 30 is a view showing in a magnifying manner an acoustic resonance portion of the film bulk acoustic wave device according to Embodiment 13 of the present invention. FIG. 31 is a graph showing a dispersion characteristic of the film bulk acoustic wave device illustrated in FIG. 30. Other constructions of the film bulk acoustic wave device according to Embodiment 13 are the same as those in Embodiment 12.

In FIG. 30, reference symbol 31 denotes a piezoelectric film of a region where the top electrode 4 and the dielectric 27A overlap each other.

In FIG. 31, reference symbol 32 denotes a dispersion characteristic of the piezoelectric film 31 of the region where the top electrode 4 and the dielectric 27A overlap each other.

In the film bulk acoustic wave device shown in FIG. 30, the reflection surface 26 of energy trapped resonance corresponds to the surface below the end surface of the dielectric 27A overlapping the top electrode 4. The cut-off frequency "$f_{0f2}$" of the piezoelectric film 31 of the region where the top electrode 4 and the dielectric 27A overlap each other is a lower frequency than the cut-off frequency "$f_{0m}$" of the top electrode portion piezoelectric film 28a, owing to both the electrode thickness "$d_1$" plus the mass load effect of the top electrode 4 and the film thickness "$d_2$" plus the mass load effect of the dielectric 27A.

Therefore, energy trapping takes place in the frequency band between the cut-off frequency "$f_{0m}$" of the top electrode portion piezoelectric film 28a and the cut-off frequency "$f_{0f2}$" of the piezoelectric film 31 of the region where the top electrode 4 and the dielectric 27A overlap each other. That is, filter operation by energy trapping may be realized.

In the film bulk acoustic wave device shown in FIG. 30, it is sufficient that the film thickness "$d_2$" and the density "$\rho_2$" of the dielectric 27A can lower the cut-off frequency "$f_{0f2}$" of the piezoelectric film 31 of the region where the top electrode 4 and the dielectric 27A overlap each other to the degree required for filter operation, and the limitation put on the electrode thickness "$d_1$" and the density "$\rho_1$" of the top electrode 4 is less strict than in the case shown in FIG. 28. This is because of the structure in which the dielectric 27A overlaps the top electrode 4.

Embodiment 14

Figure 32:
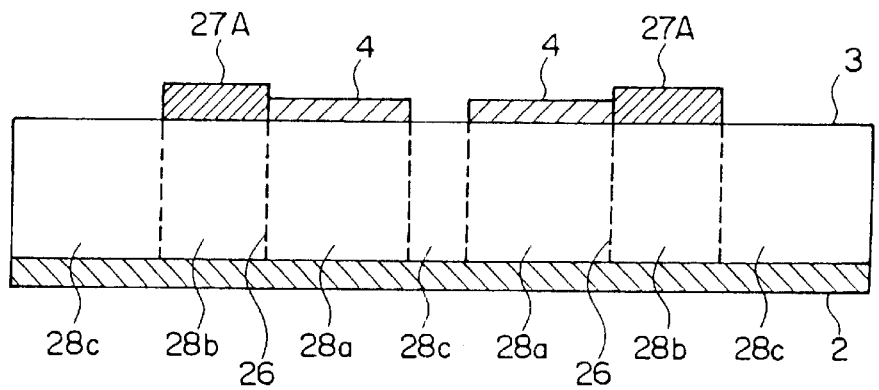
FIG. 32 is a view showing a film bulk acoustic wave device according to Embodiment 14 of the present invention.

A description will be made with reference to FIG. 32 on a film bulk acoustic wave device according to Embodiment 14 of the present invention. FIG. 32 is a view showing in a magnifying manner an acoustic resonance portion of the film bulk acoustic wave device according to Embodiment 14 of the present invention. Other constructions of the film bulk acoustic wave device according to Embodiment 14 are the same as those in Embodiment 12.

The film bulk acoustic wave device shown in FIG. 32 corresponds to the top electrode 4 and the dielectric 27A in the film bulk acoustic wave device shown in FIG. 28, which are connected with each other. Accordingly, operation principle of energy trapping is the same as in the case of the piezoelectric film shown in FIG. 28.

The mass load by the dielectric 27A is thus required to be larger than the mass load by the top electrode 4. In other words, the product of the film thickness "$d_2$" of the dielectric 27A and the density "$\rho_2$" thereof ($d_2\rho_2$) needs to be larger than the product of the electrode thickness "$d_1$" of the top electrode 4 and the density "$\rho_1$" thereof ($d_1\rho_1$).

Embodiment 15

Figure 33:
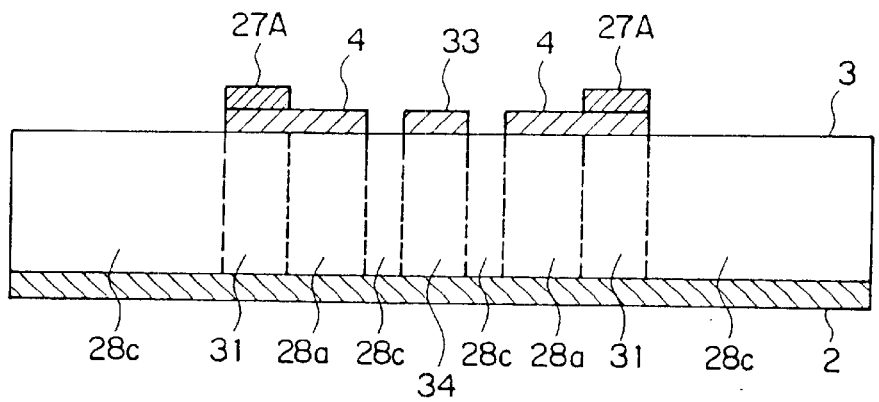
FIG. 33 is a view showing a film bulk acoustic wave device according to Embodiment 15 of the present invention.
Figure 34:
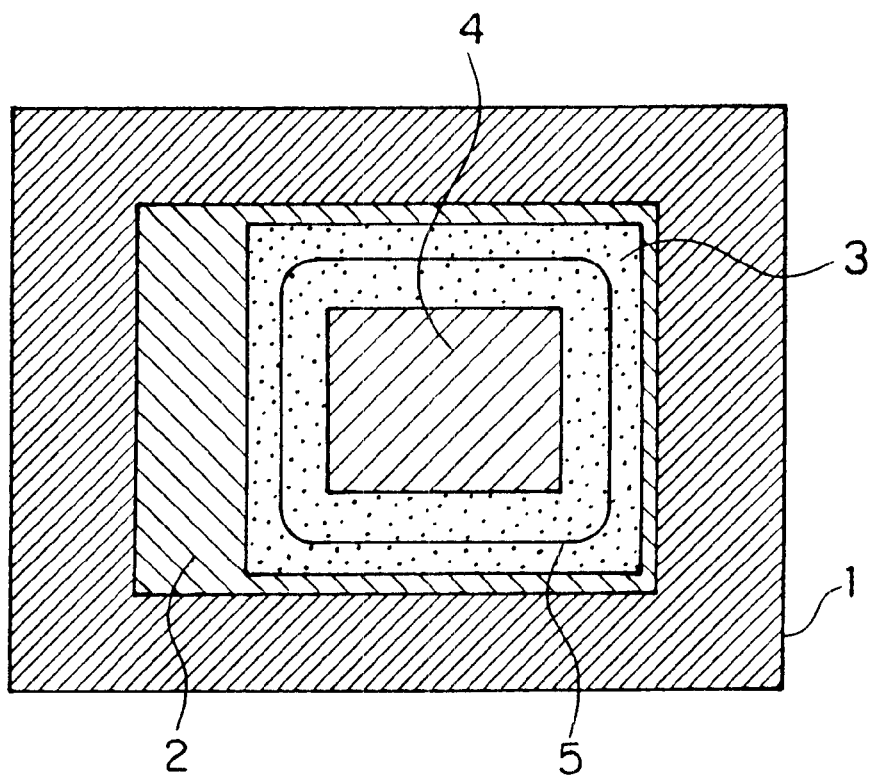
FIG. 34 is a view showing the top of a film bulk acoustic wave device of the prior art.
Figure 35:
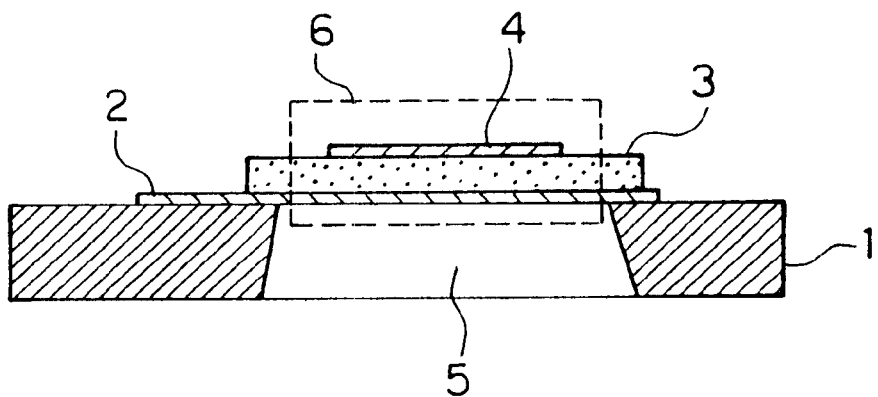
FIG. 35 is a view showing in section the film bulk acoustic wave device illustrated in FIG. 34.
Figure 36:
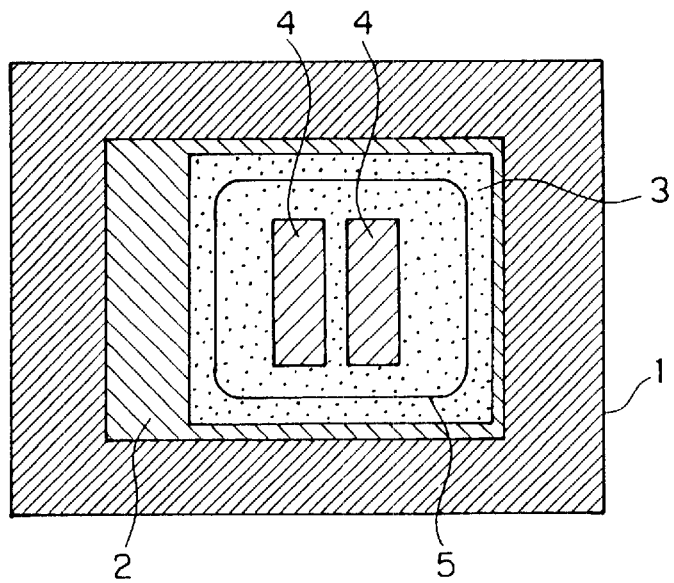
FIG. 36 is a view showing the top of another film bulk acoustic wave device of the prior art.
Figure 37:
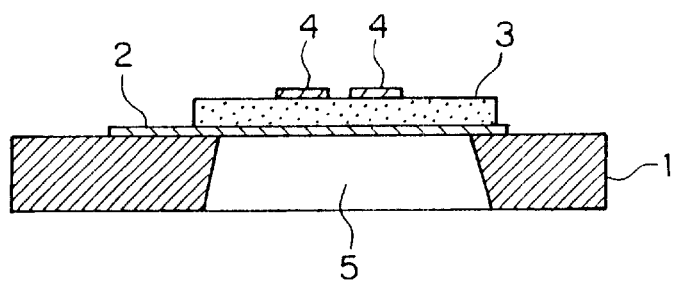
FIG. 37 is a view showing in section the film bulk acoustic wave device illustrated in FIG. 36.
Figure 38:
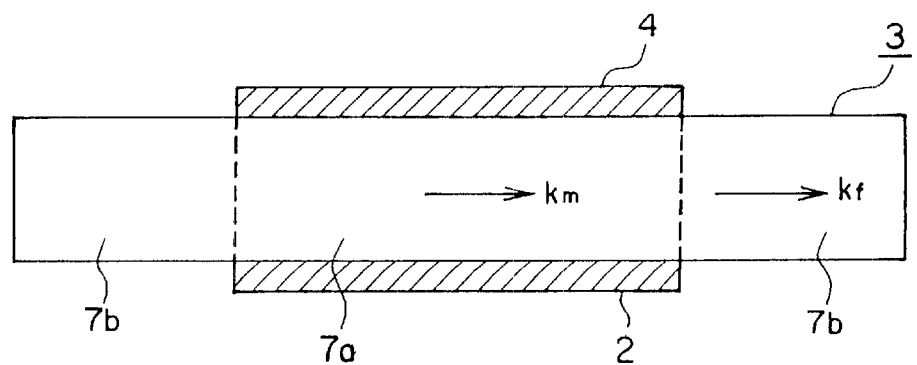
FIG. 38 is an enlarged view of an acoustic resonance portion shown in FIG. 34.
Figure 39:
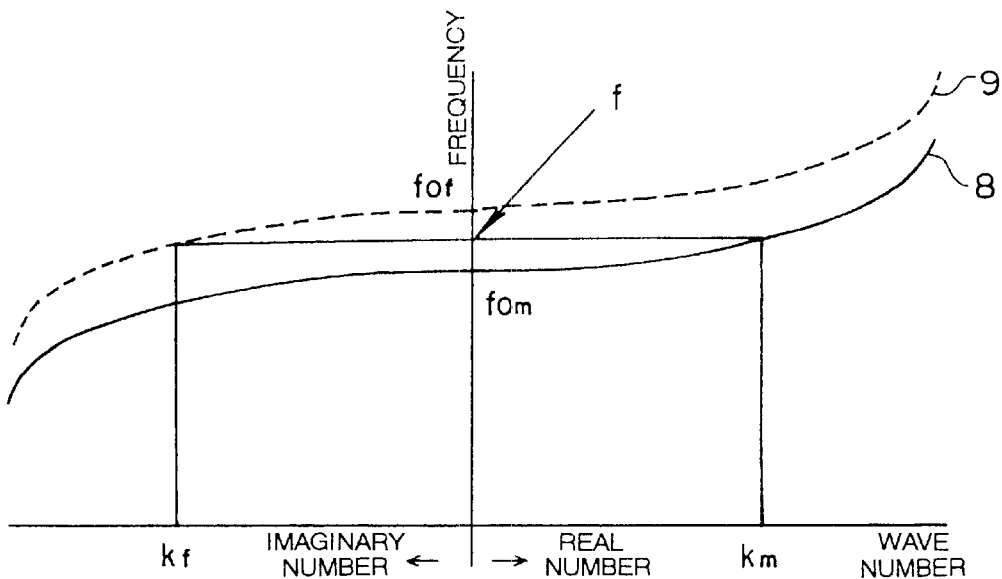
FIG. 39 is a graph showing an example of a propagation characteristic of an acoustic wave.
Figure 40:
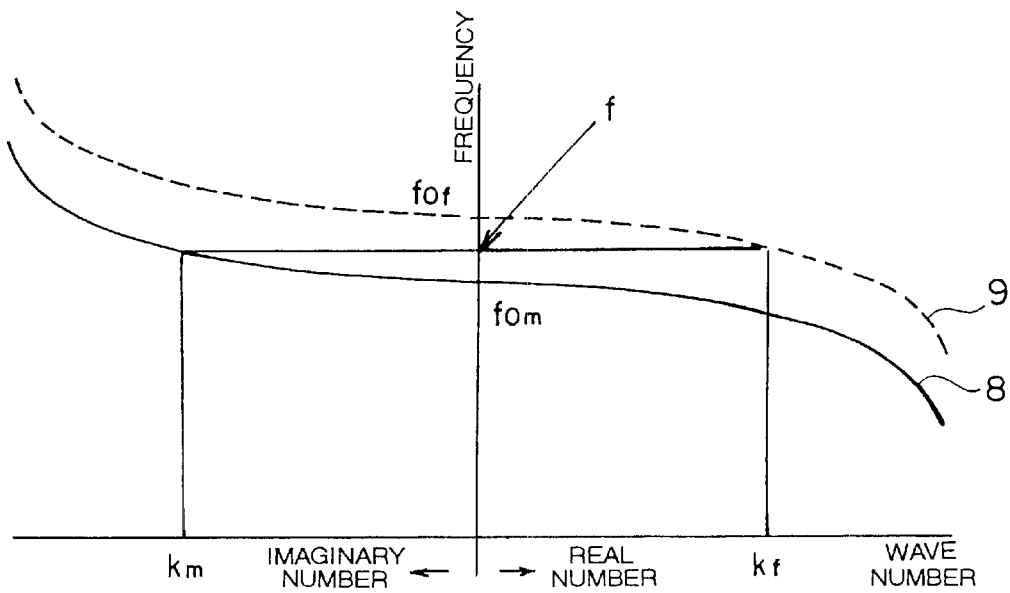
FIG. 40 is a graph showing an example of a high-band-cut-off-type dispersion characteristic.
Figure 41:
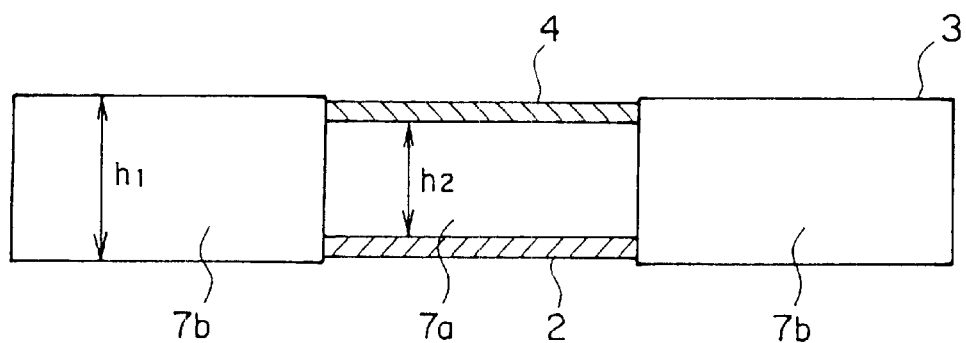
FIG. 41 is a view showing in section a piezoelectric device of the prior art.
Figure 42:
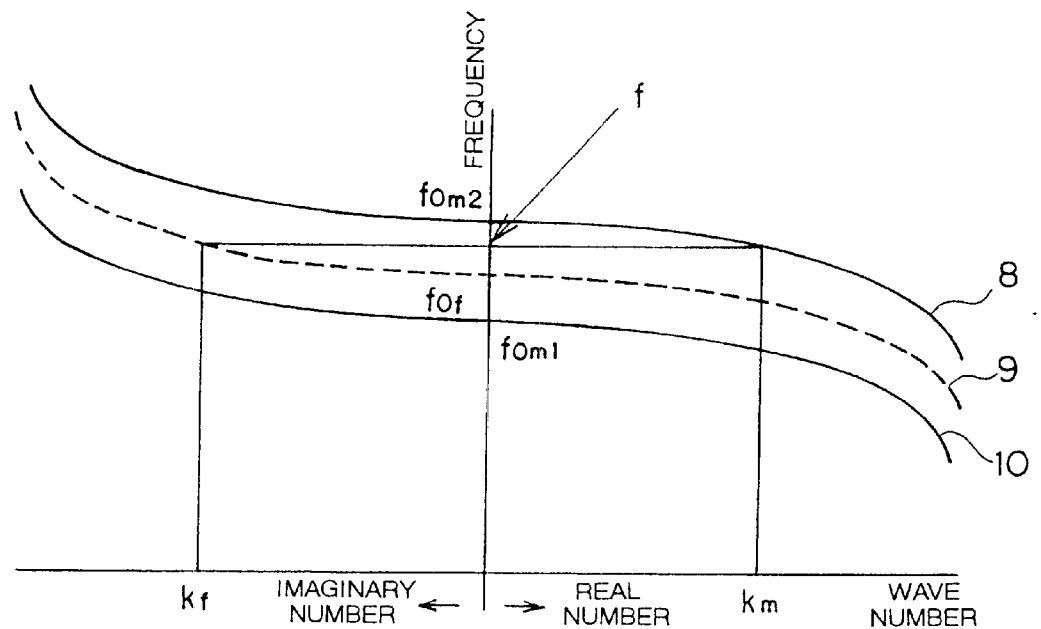
FIG. 42 is a graph showing a dispersion characteristic of the piezoelectric device illustrated in FIG. 41.
Figure 43:
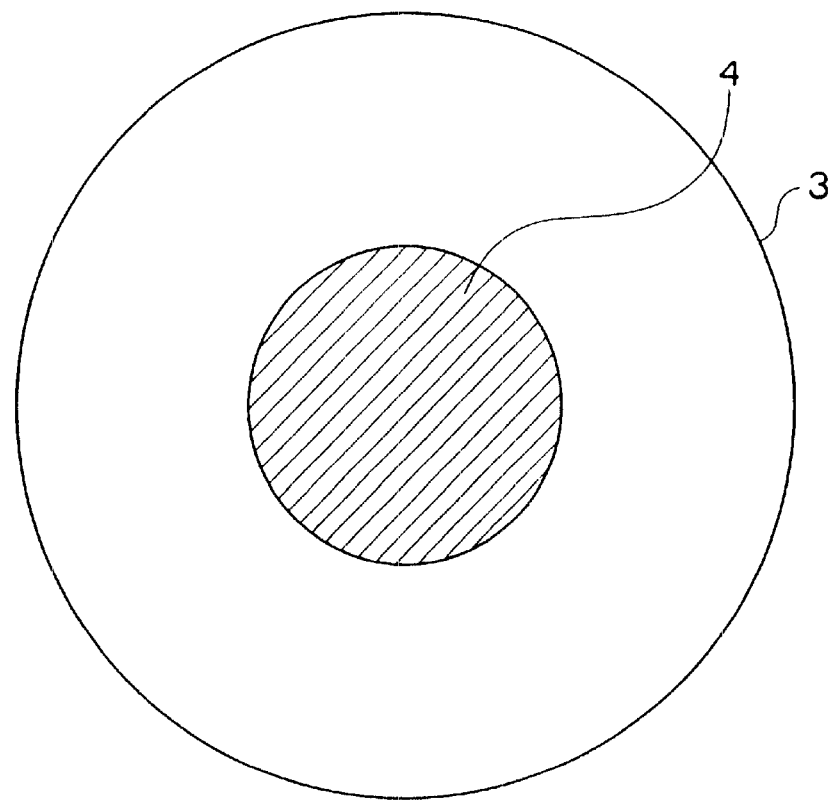
FIG. 43 is a view showing the top of another piezoelectric device of the prior art.
Figure 44:
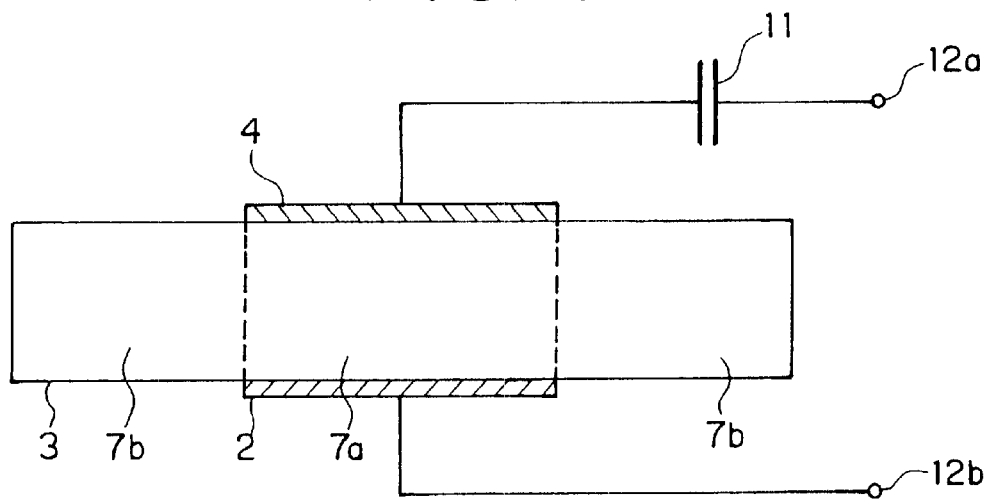
FIG. 44 is a view showing in section the piezoelectric device illustrated in FIG. 43.
Figure 45:
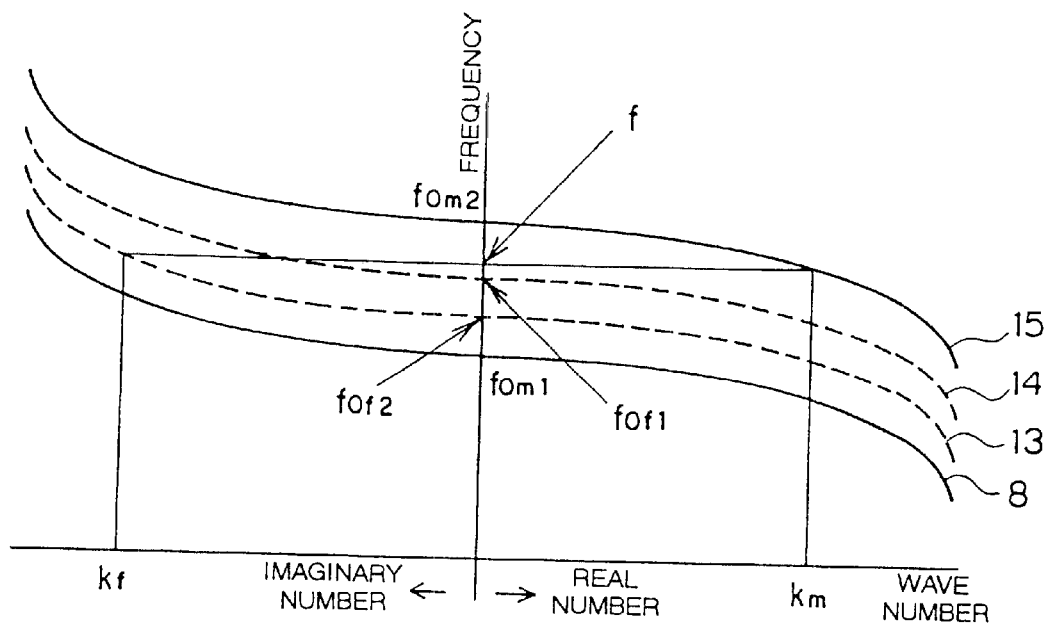
FIG. 45 is a graph showing a dispersion characteristic of the piezoelectric device illustrated in FIGS. 43 and 44.
Figure 46:
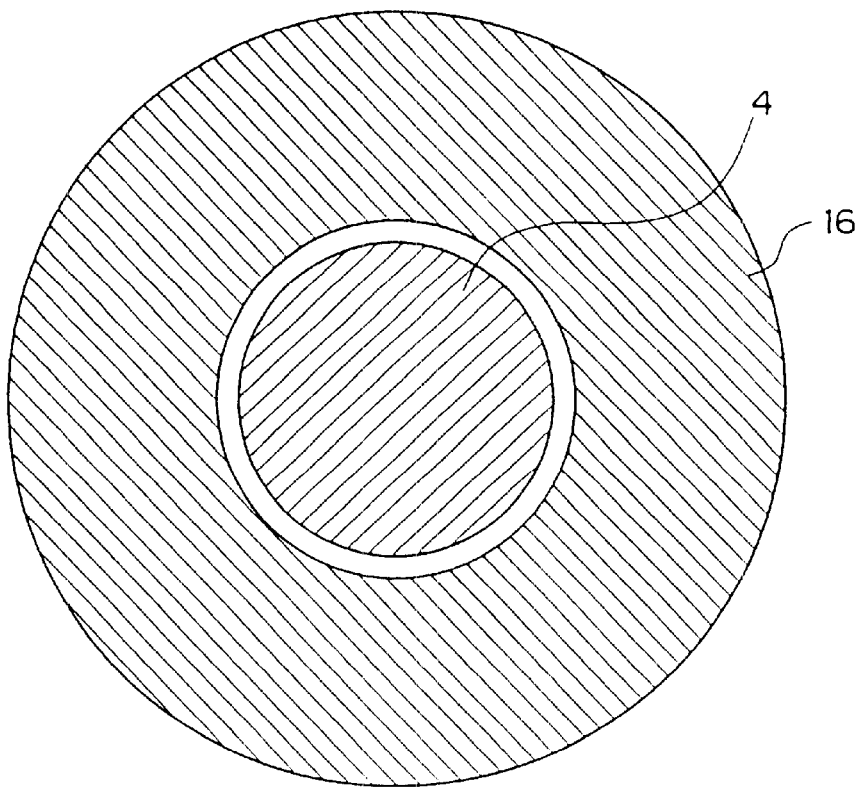
FIG. 46 is a view showing the top of still another piezoelectric device of the prior art.
Figure 47:
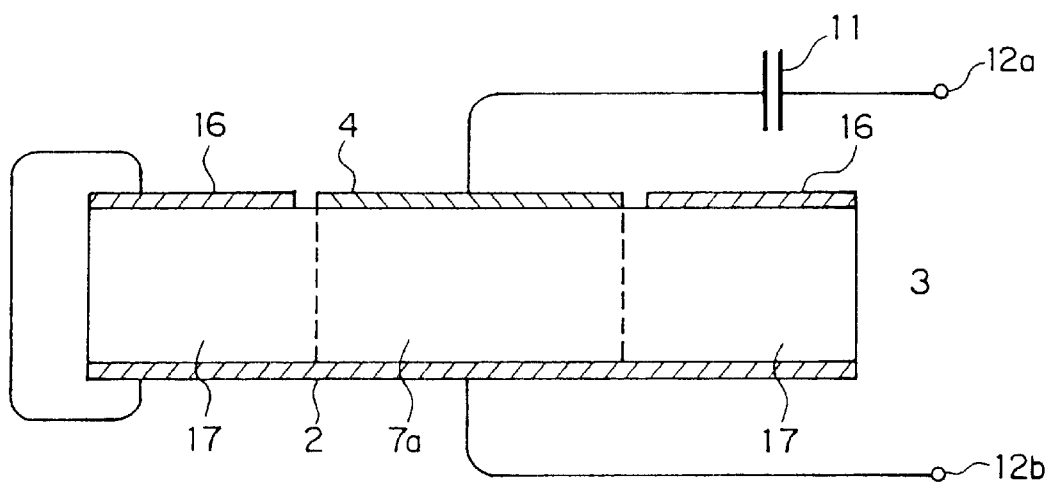
FIG. 47 is a view showing in section the piezoelectric device illustrated in FIG. 46.
Figure 48:
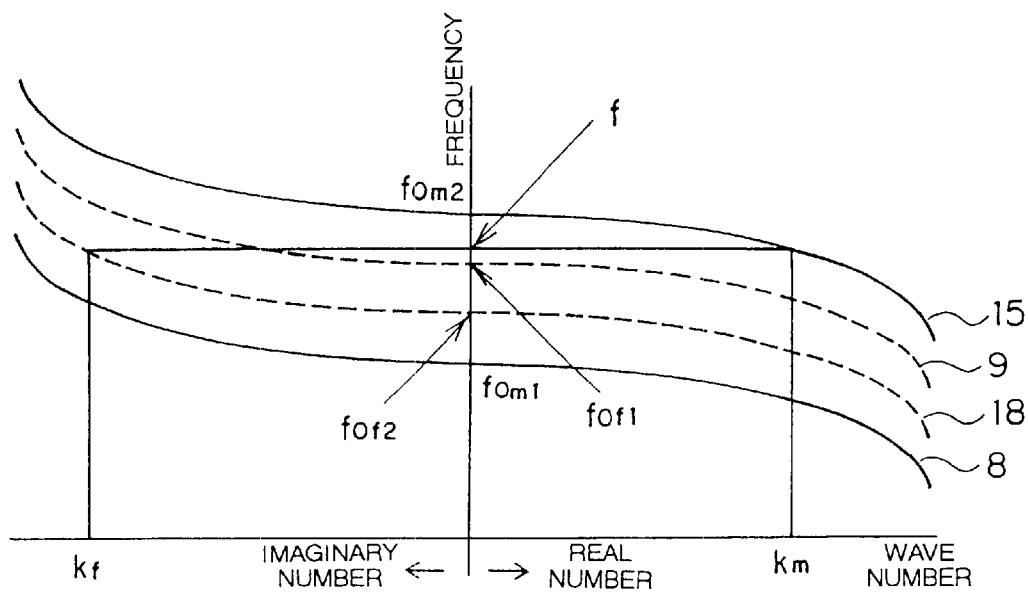
FIG. 48 is a graph showing a dispersion characteristic of the piezoelectric device illustrated in FIGS. 46 and 47.

A description will be made with reference to FIG. 33 on a film bulk acoustic wave device according to Embodiment 15 of the present invention. FIG. 33 is a view showing in a magnifying manner an acoustic resonance portion of the film bulk acoustic wave device according to Embodiment 15 of the present invention. Other constructions of the film bulk acoustic wave device according to Embodiment 15 are the same as those in Embodiment 12.

In FIG. 33, reference symbol 33 denotes a second top electrode, and reference symbol 34 denotes a second top electrode portion piezoelectric film.

The second top electrode 33 is inserted to improve the degree of freedom in designing the filter characteristic in the film bulk acoustic wave device. The dispersion characteristic of this second top electrode portion piezoelectric film 34 is close to the dispersion characteristic of the first top electrode portion piezoelectric film 28a. Namely, the cut-off frequency "$f_{0f3}$" of the second top electrode portion piezoelectric film 34 may be considered as being close to the cut-off frequency "$f_{0m}$" of the first top electrode portion piezoelectric film 28a.

Accordingly, the dispersion characteristic of the piezoelectric film shown in FIG. 33 may be deduced with the use of FIG. 31. That is, the reflection surface 26 of energy trapping corresponds to the surface below and on the inner side to the end surface of the dielectric 27A overlapping the first top electrode 4.

The present invention is not limited to a piezoelectric film such as lead titanate ($PbTiO_3$), lead zirconate titanate (PZT), lithium tantalate ($LiTaO_3$) and a piezoelectric film with Poisson ratio σ of ⅓ or less, but may be applied to all the piezoelectric bodies that exhibit the high-band-cut-off-type dispersion characteristic.

The methods shown in FIGS. 28, 30 and 32 may be applied to the resonator shown in FIGS. 18 and 19.

The methods shown in FIGS. 24, 25, 28, 30 and 32 may be applied, as shown in FIG. 33, to the case in which the film bulk acoustic wave device consists of more electrodes than in the two-electrode construction.

Though the air bridge 21 is used to fetch an electric signal from the top electrode 4 in FIGS. 18, 19 and 20, the way how to fetch the electric signal from the top electrode 4 is not necessarily limited to the air bridge 21 but may be a method of constructing a line on the surface of the piezoelectric film 3 or other arbitrary methods.

The via hole 5 shown is pierced from the back surface of the semiconductor substrate 19, but is not necessarily limited thereto. It makes no difference when the via hole is formed through a method in which an aperture is formed below the acoustic resonance portion 6 through anisotropic etching or the like starting from the front surface of the semiconductor substrate 19, a method in which a layer-like aperture is formed by removing a previously prepared thin film with etching or the like, or a method in which several layers that are different in acoustical property with one another are layered so that an acoustic wave propagating along the thickness direction is reflected on that multi-layer structure.

INDUSTRIAL APPLICABILITY

To begin with, a film bulk acoustic wave device in accordance with the present invention is designed to have a second electrode with an increased thickness placed on the top of a top electrode or the like, and the structure is as follows.

As has been described, A film bulk acoustic wave device in accordance with the present invention, comprising: a substrate; a bottom electrode formed on one surface of the substrate; a piezoelectric film formed on the bottom electrode; and a first top electrode formed on the piezoelectric film, further comprises a second top electrode having a larger mass load than the first top electrode, which is formed at an outer side of the first top electrode on the piezoelectric film when viewed from the center of the first top electrode, in which the piezoelectric film has a high-band-cut-off-type dispersion characteristic. The cut-off frequency of a second top electrode portion piezoelectric film having a large mass load can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is further provided in accordance with the present invention, wherein the first and second top electrodes are integrally formed, and the second top electrode has a larger thickness than that of the first top electrode. The cut-off frequency of a second top electrode portion piezoelectric film having a larger thickness can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is still further provided in accordance with the present invention, wherein the product of the electrode thickness and the density of the second top electrode is larger than the product of the electrode thickness and the density of the first top electrode. The cut-off frequency of a second top electrode portion piezoelectric film with larger product of the electrode thickness and the density can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is still further provided in accordance with the present invention, wherein the second top electrode is laid on a part of the first top electrode. The cut-off frequency of the piezoelectric film of the electrode where the second top electrode and the first top electrode overlap each other can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is still further provided in accordance with the present invention, wherein the first top electrode and the second top electrode are connected with each other. The cut-off frequency of a second top electrode portion piezoelectric film having a large mass load can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is still further provided in accordance with the present invention, wherein the second top electrode having a narrower width than that of the first top electrode is laid on the first top electrode. The cut-off frequency of the piezoelectric film of the electrode where the second top electrode and the first top electrode overlap each other can be lower than the cut-off frequency of a first top electrode portion piezoelectric film, to thereby trap the energy of the acoustic wave in a region of the first top electrode portion side. This serves such an effect that good performance may be feasible.

As has been described, a film bulk acoustic wave device is still further provided in accordance with the present invention, wherein the first and second top electrodes are divided into two. This serves such an effect that performance of good filter characteristics may be feasible.

As has been described, a film bulk acoustic wave device is still further provided in accordance with the present invention, wherein a third top electrode is formed on the piezoelectric film between the two divided first top electrodes. This serves such effects that performance of good filter characteristics may be feasible and that the degree of freedom in designing the filter characteristics may be improved.

As has been described, a film bulk acoustic wave device is still further provided in accordance with the present invention, wherein the substrate is a semiconductor substrate or a dielectric substrate. This serves such an effect that good performance may be feasible.

As has been described, a film bulk acoustic wave device is still further provided in accordance with the present invention, wherein the piezoelectric film has a Poisson ratio lower than 0.34. This serves such effects that a piezoelectric film having a large electromechanical coupling coefficient can be used and that good performance may be feasible.

As has been described, a film bulk acoustic wave device is still further provided in accordance with the present invention, wherein the piezoelectric film contains lead titanate ($PbTiO_3$) as a major component. This serves such effects that a piezoelectric film having a large electromechanical coupling coefficient can be used and that good performance may be feasible.

As has been described, a film bulk acoustic wave device is still further provided in accordance with the present invention, wherein a dielectric layer is inserted between the substrate and the bottom electrode. This serves such an effect that good performance may be feasible.

Next, a film bulk acoustic wave device in accordance with the present invention is designed to have a dielectric placed on the top of a top electrode or the like, and the structure is as follows.

A film bulk acoustic wave device in accordance with the present invention, comprising: a substrate; a bottom electrode formed on one surface of the substrate; a piezoelectric film formed on the bottom electrode; and a top electrode formed on the piezoelectric film, further comprises a dielectric formed at an outer side of the top electrode on the piezoelectric film when viewed from the center of the top electrode, in which the piezoelectric film has a high-band-cut-off-type dispersion characteristic. The cut-off frequency of a dielectric portion piezoelectric film can be lower than the cut-off frequency of a top electrode portion piezoelectric film, to thereby trap the energy of the acoustic wave in a region of the top electrode portion side. This serves such an effect that good performance may be feasible.

As has been described, a film bulk acoustic wave device is further provided in accordance with the present invention, wherein the dielectric is formed on a part of the top electrode, to thereby trap the energy of the acoustic wave in a region of the top electrode portion side. This serves such an effect that good performance may be feasible.

As has been described, a film bulk acoustic wave device is still further provided in accordance with the present invention, wherein the product of the film thickness and the density of the dielectric is larger than the product of the electrode thickness and the density of the top electrode. The cut-off frequency of the dielectric with larger product of the electrode thickness and the density can be lower than the cut-off frequency of a top electrode portion piezoelectric film, to thereby trap the energy of the acoustic wave in a region of the top electrode portion side. This serves such an effect that good performance may be feasible.

As has been described, a film bulk acoustic wave device is still further provided in accordance with the present invention, wherein the dielectric is laid on a part of the top electrode. The cut-off frequency of the piezoelectric film of the electrode where the dielectric and the top electrode overlap each other can be lower than the cut-off frequency of a top electrode portion piezoelectric film, to thereby trap the energy of the acoustic wave in a region of the top electrode portion side. This serves such an effect that good performance may be feasible.

As has been described, a film bulk acoustic wave device is still further provided in accordance with the present invention, wherein the top electrode and the dielectric are connected with each other. The cut-off frequency of a dielectric portion piezoelectric film can be lower than the cut-off frequency of a top electrode portion piezoelectric film, to thereby trap the energy of the acoustic wave in a region of the top electrode portion side. This serves such an effect that good performance may be feasible.

As has been described, a film bulk acoustic wave device is still further provided in accordance with the present invention, wherein the dielectric having a narrower width than that of the top electrode is laid on the top electrode. The cut-off frequency of the piezoelectric film of the electrode where the dielectric and the top electrode overlap each other can be lower than the cut-off frequency of a top electrode portion piezoelectric film, to thereby trap the energy of the acoustic wave in a region of the top electrode portion side. This serves such an effect that good performance may be feasible.

As has been described, a film bulk acoustic wave device is still further provided in accordance with the present invention, wherein the top electrode and the dielectric are divided into two. This serves such an effect that performance of good filter characteristics may be feasible.

As has been described, a film bulk acoustic wave device is still further provided in accordance with the present invention, wherein a second top electrode is formed on the piezoelectric film between the two divided first top electrodes. This serves such effects that performance of good filter characteristics may be feasible and that the degree of freedom in designing the filter characteristics may be improved.

As has been described, a film bulk acoustic wave device is still further provided in accordance with the present invention, wherein the substrate is a semiconductor substrate or a dielectric substrate. This serves such an effect that good performance may be feasible.

As has been described, a film bulk acoustic wave device is still further provided in accordance with the present invention, wherein the piezoelectric film has a Poisson ratio lower than 0.34. This serves such effects that a piezoelectric film having a large electromechanical coupling coefficient can be used and that good performance may be feasible.

As has been described, a film bulk acoustic wave device is still further provided in accordance with the present invention, wherein the piezoelectric film contains lead titanate ($PbTiO_3$) as a major component. This serves such effects that a piezoelectric film having a large electromechanical coupling coefficient can be used and that good performance may be feasible.

As has been described, a film bulk acoustic wave device is still further provided in accordance with the present invention, wherein a dielectric layer is inserted between the substrate and the bottom electrode. This serves such an effect that good performance may be feasible.

We claim:

1. A film bulk acoustic wave device comprising:
a substrate;
a bottom electrode formed on one surface of said substrate;
a piezoelectric film formed on said bottom electrode; and
a first top electrode formed on said piezoelectric film,
wherein said film bulk acoustic wave device further comprises a second top electrode having a larger mass load than said first top electrode in a propagation direction of an acoustic wave propagating along a surface, and formed on said first top electrode at an outer side of said piezoelectric film when viewed from the center of said first top electrode, and
said piezoelectric film has a high-band-cut-off-type dispersion characteristic.

2. A film bulk acoustic wave device as claimed in claim 1, wherein said first and second top electrodes are integrally formed, and said second top electrode has a larger thickness than that of said first top electrode.

3. A film bulk acoustic wave device as claimed in claim 1, wherein the product of the electrode thickness and the density of said second top electrode is larger than the product of the electrode thickness and the density of said first top electrode.

4. A film bulk acoustic wave device as claimed in claim 1, wherein that said second top electrode is laid on a part of said first top electrode.

5. A film bulk acoustic wave device as claimed in claim 1, wherein said first top electrode and said second top electrode are connected with each other.

6. A film bulk acoustic wave device as claimed in claim 1, wherein said second top electrode having a narrower width than that of said first top electrode is laid on said first top electrode.

7. A film bulk acoustic wave device as claimed in claim 1, wherein first and second top electrodes are divided into two.

8. A film bulk acoustic wave device as claimed in claim 7, wherein a third top electrode is formed on said piezoelectric film between said two divided first top electrodes.

9. A film bulk acoustic wave device as claimed in claim 1, wherein said substrate is a semiconductor substrate or a dielectric substrate.

10. A film bulk acoustic wave device as claimed in claim 1, wherein said piezoelectric film has a Poisson ratio lower than 0.34.

11. A film bulk acoustic wave device as claimed in claim 1, wherein piezoelectric film contains lead titanate ($PbTiO_3$) as a major component.

12. A film bulk acoustic wave device as claimed in claim 1, wherein a dielectric layer is inserted between said substrate and said bottom electrode.

13. A film bulk acoustic wave device comprising:

a substrate;

a bottom electrode formed on one surface of said substrate;

a piezoelectric film formed on said bottom electrode; and a top electrode formed on said piezoelectric film, wherein said film bulk acoustic wave device further comprises a dielectric formed at an outer side of said top electrode on said piezoelectric film when viewed from the center of said top electrode, and said piezoelectric film has a high-band-cut-off-type dispersion characteristic.

14. A film bulk acoustic wave device as claimed in claim 13, wherein said dielectric is formed on a part of said top electrode.

15. A film bulk acoustic wave device as claimed in claim 13, wherein the product of the film thickness and the density of said dielectric is larger than the product of the electrode thickness and the density of said top electrode.

16. A film bulk acoustic wave device as claimed in claim 13, wherein said dielectric is laid on a part of said top electrode.

17. A film bulk acoustic wave device as claimed in claim 13, wherein said top electrode and said dielectric are connected with each other.

18. A film bulk acoustic wave device as claimed in claim 13, characterized in that said dielectric having a narrower width than that of said top electrode is laid on said top electrode.

19. A film bulk acoustic wave device as claimed in claim 13, wherein said top electrode and said dielectric are divided into two.

20. A film bulk acoustic wave device as claimed in claim 19, wherein a second top electrode is formed on said piezoelectric film between said two divided first top electrodes.

21. A film bulk acoustic wave device as claimed in claim 13, wherein said substrate is a semiconductor substrate or a dielectric substrate.

22. A film bulk acoustic wave device as claimed in claim 13, wherein said piezoelectric film has a Poisson ratio lower than 0.34.

23. A film bulk acoustic wave device as claimed in claim 13, wherein said piezoelectric film contains lead titanate ($PbTiO_3$) as a major component.

24. A film bulk acoustic wave device as claimed in claim 13, wherein a dielectric layer is inserted between said substrate and said bottom electrode.

* * * * *

UNITED STATES PATENT AND TRADEMARK OFFICE
CERTIFICATE OF CORRECTION

| | | |
|---|---|---|
| PATENT NO. | : 6,396,200 B2 | |
| DATED | : May 28, 2002 | |
| INVENTOR(S) | : Koichiro Misu, Tsutomu Nagatsuka and Shusou Wadaka | |

It is certified that error appears in the above-identified patent and that said Letters Patent is hereby corrected as shown below:

<u>Title page,</u>
Item [54], replace the title with the following:
-- [54] FILM BULK ACOUSTIC WAVE DEVICE --

Signed and Sealed this

Fifteenth Day of October, 2002

*Attest:*

JAMES E. ROGAN
*Attesting Officer*    *Director of the United States Patent and Trademark Office*